United States Patent
Colinge et al.

(10) Patent No.: US 10,559,563 B2
(45) Date of Patent: Feb. 11, 2020

(54) METHOD FOR MANUFACTURING MONOLITHIC THREE-DIMENSIONAL (3D) INTEGRATED CIRCUITS

(71) Applicant: Taiwan Semiconductor Manufacturing Co., Ltd., Hsin-Chu (TW)

(72) Inventors: Jean-Pierre Colinge, Hsinchu (TW); Carlos H. Diaz, Mountain View, CA (US); Ta-Pen Guo, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 106 days.

(21) Appl. No.: 15/633,016

(22) Filed: Jun. 26, 2017

(65) Prior Publication Data
US 2018/0374845 A1    Dec. 27, 2018

(51) Int. Cl.
*H01L 27/11578* (2017.01)
*H01L 27/06* (2006.01)
(Continued)

(52) U.S. Cl.
CPC .... *H01L 27/0688* (2013.01); *H01L 21/30604* (2013.01); *H01L 21/324* (2013.01);
(Continued)

(58) Field of Classification Search
None
See application file for complete search history.

(56) References Cited

U.S. PATENT DOCUMENTS 8,395,942 B2   3/2013   Samachisa et al.
9,691,695 B2   6/2017   Guo et al.
(Continued)

FOREIGN PATENT DOCUMENTS

KR    20160131677 A    11/2016

OTHER PUBLICATIONS

Sailor, Michael J. "Porous Silicon in Practice: Preparation, Characterization and Applications." Chapter 1: Fundamentals of Porous Silicon Preparation. Published 2012 by Wiley-VCH Verlag GmbH & Co. KGaA.
(Continued)

*Primary Examiner* — Joseph C. Nicely
*Assistant Examiner* — Lamont B Koo
(74) *Attorney, Agent, or Firm* — Eschweiler & Potashnik LLC

(57) ABSTRACT

A method for manufacturing a monolithic three-dimensional (3D) integrated circuit (IC) with junctionless semiconductor devices (JSDs) is provided. A first interlayer dielectric (ILD) layer is formed over a semiconductor substrate, while also forming first vias and first interconnect wires alternatingly stacked in the first ILD layer. A first doping-type layer and a second doping-type layer are transferred to a top surface of the first ILD layer. The first and second doping-type layers are stacked and are semiconductor materials with opposite doping types. The first and second doping-type layers are patterned to form a first doping-type wire and a second doping-type wire overlying the first doping-type wire. A gate electrode is formed straddling the first and second doping-type wires. The gate electrode and the first and second doping-type wires at least partially define a JSD.

20 Claims, 21 Drawing Sheets

(51) Int. Cl.

| | |
|---|---|
| H01L 23/522 | (2006.01) |
| H01L 23/528 | (2006.01) |
| H01L 21/8234 | (2006.01) |
| H01L 21/683 | (2006.01) |
| H01L 21/306 | (2006.01) |
| H01L 21/324 | (2006.01) |
| H01L 29/08 | (2006.01) |
| H01L 21/822 | (2006.01) |
| H01L 29/06 | (2006.01) |
| H01L 29/423 | (2006.01) |
| H01L 29/786 | (2006.01) |
| H01L 29/78 | (2006.01) |
| H01L 21/8238 | (2006.01) |

(52) U.S. Cl.
CPC ...... *H01L 21/6835* (2013.01); *H01L 21/8221* (2013.01); *H01L 21/823412* (2013.01); *H01L 21/823418* (2013.01); *H01L 21/823437* (2013.01); *H01L 21/823475* (2013.01); *H01L 21/823807* (2013.01); *H01L 23/528* (2013.01); *H01L 23/5226* (2013.01); *H01L 29/0673* (2013.01); *H01L 29/0847* (2013.01); *H01L 29/42392* (2013.01); *H01L 29/785* (2013.01); *H01L 29/786* (2013.01); *H01L 21/82385* (2013.01); *H01L 21/823814* (2013.01); *H01L 2221/68363* (2013.01)

(56) References Cited

U.S. PATENT DOCUMENTS

| | | | |
|---|---|---|---|
| 2013/0203248 A1* | 8/2013 | Ernst | ............ H01L 21/8221 438/530 |
| 2014/0131769 A1 | 5/2014 | Park et al. | |
| 2015/0102466 A1* | 4/2015 | Colinge | ............ H01L 29/0673 257/618 |
| 2015/0262888 A1 | 9/2015 | Colinge | |
| 2016/0043074 A1 | 2/2016 | Hurley et al. | |
| 2016/0197076 A1 | 7/2016 | Kamata | |
| 2017/0092756 A1 | 3/2017 | Lai et al. | |

OTHER PUBLICATIONS

3DIC.org. "CoolCube." Retrieved from http://www.3dic.org/CoolCube Published on Nov. 30, 2016.

Korczynski, Ed. "Leti's CoolCube 3d Transistor Stacking Improves with Qualcomm Help." Retrieved from http://semimd.com/blog/tag/coolcube Published on Apr. 27, 2016.

Yonehara, et al. "Cutting Edge 2, ELTRAN; Novel SOI Wafer Technology." JSAP International, No. 4 (Jul. 2001).

Colinge, et al. "Junctionless Nanowire Transistor (JNT): Properties and Design Guidelines." Solid-State Electronics 65-66 (2011) 33-37. Published on Jul. 27, 2011.

SmartCut Technology, Smart Choice—Soitec. Retrieved from http://www.soitec.com/en/products/smart-cut Published in 2016.

Batude, et al. "3DVLSI with CoolCube Process: An Alternative Path to Scaling." 2015 Symposium on VLSI Technology Digest of Technical Papers. Published Jun. 2015.

Thirunavukkarasu, et al. "Performance of Inversion, Accumulation, and Junctionless Mode n-Type and p-Type Bulk Silicon FinFETs With 3-nm Gate Length." IEEE Electron Device Letters, vol. 36, No. 7, Jul. 2015.

Brunet, et al. "First Demonstration of a CMOS over CMOS 3D VLSI CoolCube Integration on 300mm Wafers." IEEE 2016 Symposium on VLSI Technology Digest of Technical Papers, Jun. 2016.

U.S. Appl. No. 15/196,126, filed Jun. 29, 2016.

* cited by examiner

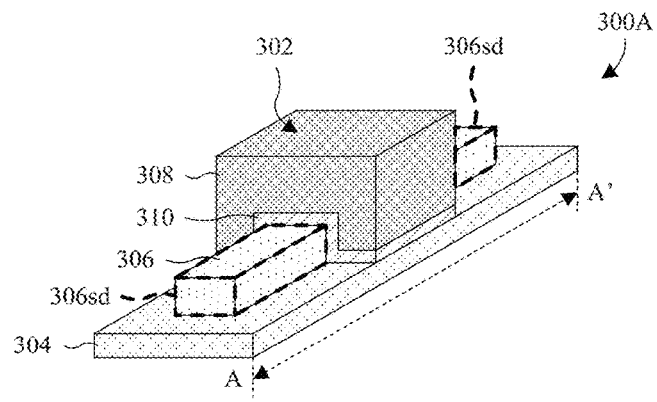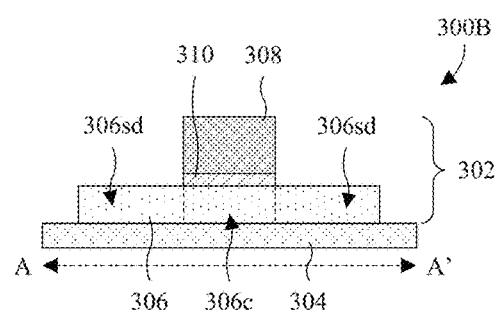
Fig. 3A                Fig. 3B
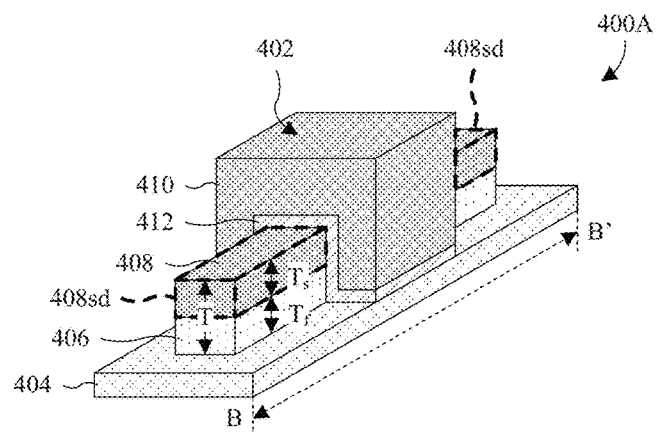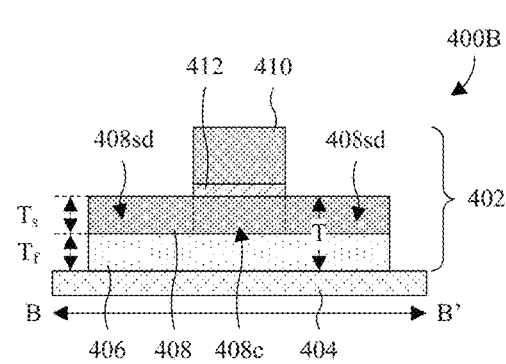
Fig. 4A                Fig. 4B

METHOD FOR MANUFACTURING MONOLITHIC THREE-DIMENSIONAL (3D) INTEGRATED CIRCUITS

BACKGROUND

The semiconductor manufacturing industry continually seeks to improve the processing capabilities and power consumption of integrated circuits (ICs). Traditionally, this has been achieved by shrinking the minimum feature size. However, in recent years, process limitations have made it difficult to continue shrinking the minimum feature size. Therefore, the stacking of multiple device layers into three-dimensional (3D) ICs has emerged as a potential approach to continue improving processing capabilities and power consumption of ICs. One type of 3D IC is a monolithic 3D IC in which multiple device layers are formed directly on a single semiconductor substrate (e.g., a wafer).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B illustrate various views of some embodiments a first doping-type JSD in FIG. 2.

FIGS. 4A and 4B illustrate various views of some embodiments a second doping-type JSD in FIG. 2.

DETAILED DESCRIPTION

Figure 1:
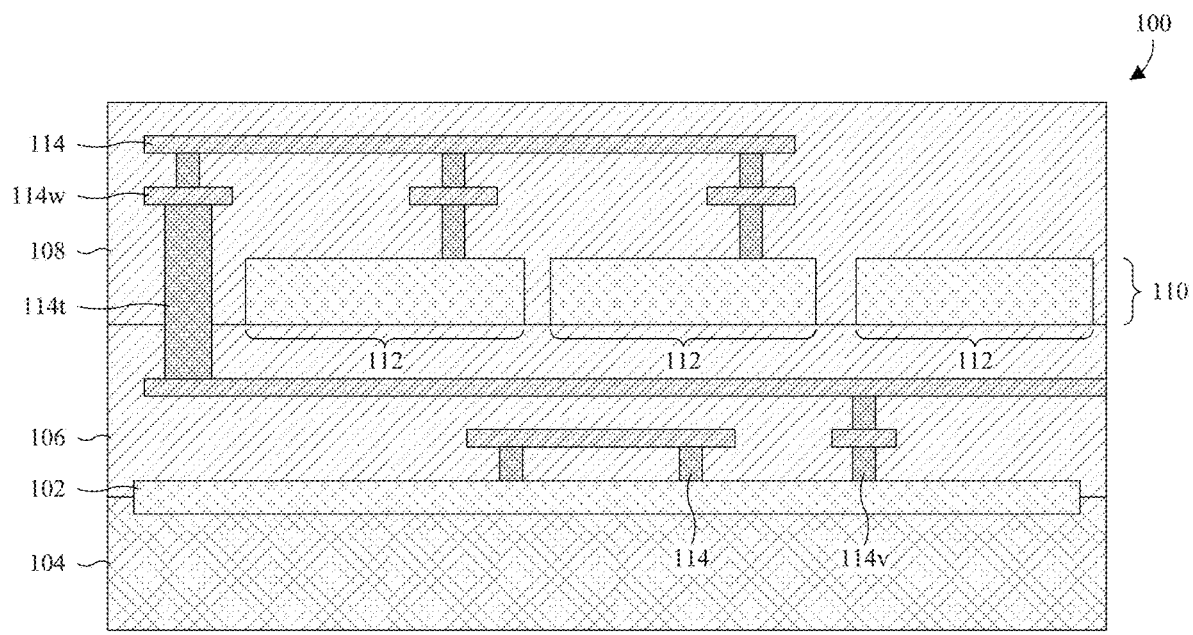
FIG. 1 illustrates a cross-sectional view of some embodiments of a monolithic three-dimensional (3D) integrated circuit (IC) with junctionless semiconductor devices (JSDs).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., conductive wire) may be referred to as a "first" element in some embodiments, the element may be referred to as a "second" element in other embodiments.

A monolithic three-dimensional (3D) integrated circuit (IC) comprises a first device layer in a semiconductor substrate, and a first interlayer dielectric (ILD) layer covering the semiconductor substrate and the first device layer. A second device layer is on the first ILD layer, and a second ILD layer covers the first ILD layer and the second device layer. Interconnect features (e.g., wires, vias, etc.) are stacked within the first and second ILD layers, and electrically couple the first and second device layers together.

An approach to manufacturing the second device layer comprises transferring a semiconductor layer to the ILD layer. The semiconductor layer is then patterned to define device regions, and gate stacks are formed on respective ones of the device regions. With the gate stacks formed, dopants are implanted by ion implantation into the device regions to define source/drain regions. Further, annealing is performed to recrystallize the source/drain regions, since the ion implantation may damage the semiconductor lattice. The annealing is performed at high temperatures in excess of about 600 degrees Celsius (° C.). Further, the annealing may be performed for a short duration (e.g., less than about 100 nanoseconds) at temperatures of about 1100° C. using a short wavelength laser (e.g., wavelengths less than about 800 nanometers). Alternatingly, the annealing may be performed for a long duration (e.g., several minutes or hours) at a temperature of about 630° C. using solid phase epitaxy (SPE).

A challenge with the foregoing approach to manufacturing the second device layer is that it is dependent upon annealing, and the high temperatures of the annealing are prone to damaging underlying layers. For example, the high temperatures may degrade (e.g., increase) metal resistance of at least some of the interconnect features. As another example, the high temperatures may lead to metal contamination of semiconductor layers or structures (e.g., the semiconductor substrate) by diffusion of metal from the interconnect features, since the high temperatures may degrade the effectiveness of diffusion barrier layers lining the interconnect features. As yet another example, the high temperatures may compromise the integrity of silicide layers (e.g., on source/drain regions). Further, reducing the annealing temperature to minimize damage reduces throughput and, hence, increases costs.

In view of the foregoing, various embodiments of the present application are directed towards a method for manufacturing monolithic 3D ICs that reduces the likelihood of damaging layers underlying upper tier device layers. In some embodiments, a first ILD layer is formed over a semiconductor substrate, while also forming first vias and first interconnect wires alternatingly stacked in the first ILD layer. A first doping-type layer and a second doping-type layer are transferred to a top surface of the first ILD layer. The first and second doping-type layers are stacked semiconductor layers with opposite doping types. The first and second doping-type layers are patterned to form a first doping-type wire and a second doping-type wire overlying the first doping-type wire. A gate electrode is formed straddling the first and second doping-type wires. The gate electrode and the first and second doping-type wires at least partially define a junctionless semiconductor device (JSD).

Advantageously, because the JSD is junctionless, ion implantation and annealing are not performed to form source/drain regions after the gate electrode is formed. Therefore, the JSD may be formed without exposing underlying layers (e.g., the first interconnect wires) to high temperatures associated with the annealing. This, in turn, allows the JSD to be formed without damaging the underlying layers. Further, the transferring advantageously allows high temperature processes that would otherwise damage the underlying layers to be performed remote from the underlying layers.

With reference to FIG. 1, a cross-sectional view 100 of some embodiments of a monolithic 3D IC is provided. As illustrated, a first device layer 102 is arranged over and within a semiconductor substrate 104. The first device layer 102 comprises a plurality of semiconductor devices (not individually shown), such as, for example, transistors, memory cells, pixel sensors, some other type of semiconductor devices, or a combination of the foregoing. A first ILD layer 106 covers the semiconductor substrate 104 and the first device layer 102, and a second ILD layer 108 covers the first ILD layer 106.

A second device layer 110 is arranged on the first ILD layer 106, between the first ILD layer 106 and the second ILD layer 108. The second device layer 110 comprises a plurality of JSDs 112, such as, for example, junctionless nanowire transistors. The JSDs 112 are semiconductor devices devoid of semiconductor junctions and doping concentration gradients. Semiconductor junctions include, for example, junctions between different semiconductor materials (e.g., heterojunctions), metal-semiconductor junctions (e.g., Schottky junctions), and junctions between different semiconductor doping types and/or doping concentrations (e.g., PN junctions, N+N junctions, P+P junctions).

Interconnect features 114 are stacked within the first and second ILD layers 106, 108, and electrically couple the first and second device layers 102, 110 together. For ease of illustration, only some of the interconnect features 114 are labeled 114. The interconnect features 114 comprise vias 114v and interconnect wires 114w, and the vias 114v comprise a through device-layer via (TDV) 114t (among other types of vias not specifically enumerated). The TDV 114t extends through the second device layer 110, from over the second device layer 110 to below the second device layer 110, to facilitate electrical coupling of the second device layer 110 to the first device layer 102. For ease of illustration, only one of the vias 114v is labeled 114v, and only one of the interconnect wires 114w is labeled 114w. The vias 114v and the interconnect wires 114w are conductive, such as, for example, aluminum copper, copper, tungsten, some other metal, or a combination of the foregoing.

Advantageously, because the JSDs 112 are junctionless, ion implantation and annealing are not performed to specifically form source/drain regions. Therefore, the second device layer 110 may be formed without exposing underlying layers (e.g., the interconnect wires 114w) to high temperatures associated with the annealing. This, in turn, allows the second device layer 110 to be formed without damaging the underlying layers. In some embodiments, the JSDs 112 are formed at temperatures less than about 500° C. or less than about 600° C. Further, in some embodiments, the JSDs 112 are formed at temperatures between about 350-500° C. and/or between about 400-450° C.

Figure 2:
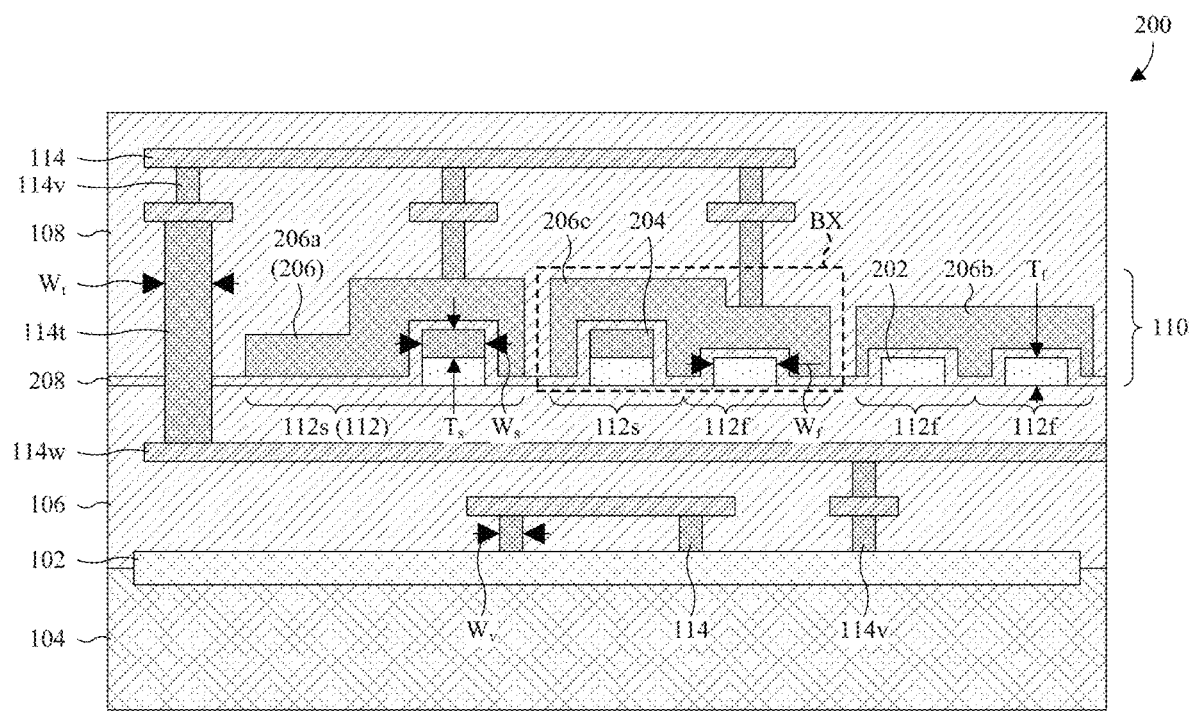
FIG. 2 illustrates a cross-sectional view of some more detailed embodiments of the monolithic 3D IC of FIG. 1.

With reference to FIG. 2, a cross-sectional view 200 of some more detailed embodiments of the monolithic 3D IC of FIG. 1 is provided. As illustrated, a first device layer 102 is arranged over and within a semiconductor substrate 104. The first device layer 102 comprises a plurality of semiconductor devices (not individually shown). The semiconductor substrate 104 may be, for example, a bulk substrate of silicon (e.g., monocrystalline silicon) or some other type of semiconductor substrate.

A first ILD layer 106 covers the semiconductor substrate 104 and the first device layer 102, and a second ILD layer 108 covers the first ILD layer 106. The first and second ILD layers 106, 108 may be, for example, silicon dioxide, a low κ dielectric, some other dielectric, or a combination of the foregoing. As used herein, a low κ dielectric is a dielectric with a dielectric constant κ less than about 3.9, 3.0, 2.0, or 1.0.

A second device layer 110 is arranged on the first ILD layer 106, between the first ILD layer 106 and the second ILD layer 108. The second device layer 110 comprises a plurality of JSDs 112. For ease of illustration, only one of the JSDs 112 is labeled 112. The JSDs 112 are semiconductor devices lacking semiconductor junctions and doping concentration gradients. The semiconductor junctions include, for example, heterojunctions, Schottky junctions, and PN junctions. The JSDs 112 comprise first doping-type JSDs 112f having selectively-conductive channels with a first doping type, and/or comprise second doping-type JSDs 112s having selectively-conductive channels with a second doping type opposite the first doping type. For example, the first doping-type JSDs 112f may be n type and the second doping-type JSDs 112s may be p type, or vice versa.

The JSDs 112 each comprise a first doping-type wire 202. For ease of illustration, only one of the first doping-type wires 202 is labeled 202. The first doping-type wires 202 are semiconductor wires with the first doping type and define the selectively-conductive channels for the first doping-type JSDs 112f. Further, the first doping-type wires 202 have a single doping type and a substantially uniform doping concentration throughout. The first doping-type wires 202 may be, for example, monocrystalline silicon or some other type of semiconductor, and/or may be, for example, laterally elongated in a direction substantially orthogonal to the cross-sectional view 200 (e.g., into and out of the page).

The second doping-type JSDs 112s, but not the first doping-type JSDs 112f, further each comprise a second doping-type wire 204. For ease of illustration, only one of the second doping-type wires 204 is labeled 204. The second doping-type wires 204 are semiconductor wires with the second doping type and define the selectively-conductive channels for the second doping-type JSDs 112s. Further, the second doping-type wires 204 at least partially cover respective ones of the first doping-type wires 204, and have a single doping type and a substantially uniform doping concentration throughout. In some embodiments, the second doping-type wires 204 are monocrystalline silicon or some other type of semiconductor material, and/or are the same semiconductor material as the first doping-type wires 202. Further, in some embodiments, the second doping-type wires 204 are laterally elongated in a direction orthogonal to the cross-sectional view 200 (e.g., into and out of the page), and/or have the same or different layouts as the respective ones of the first doping-type wires 202.

The first doping-type wires 202 each have a first width $W_f$, and the second doping-type wires 204 each have a second width $W_s$. In some embodiments, the first width $W_f$ and/or the second width $W_s$ is/are each between about 1-50 nanometers (nm), about 1-40 nm, about 4-20 nm, or about 6-14 nm. For example, the first width $W_f$ and/or the second width $W_s$ is/are each about 10 nm. Further, in some embodiments, the first width $W_f$ is substantially uniform across the first doping-type wires 202, and/or the second width $W_s$ is substantially uniform across the second doping-type wires 204. Alternatively, in some embodiments, the first width $W_f$ varies across the first doping-type wires 202, and/or the second width $W_s$ varies across the second doping-type wires 204. Further yet, in some embodiments, the first width $W_f$ is substantially the same as the second width $W_s$. Alternatively, in other embodiments, the first width $W_f$ is different than the second width $W_s$.

The first doping-type wires 202 each have a first thickness $T_f$, and the second doping-type wires 204 each have a second thickness T. In some embodiments, the first thickness $T_f$ and/or the second thickness $T_s$ is/are each be between about 1-100 nm, about 3-50 nm, about 10-30 nm, or about 1-20 nm. For example, the first thickness $T_f$ and/or the second thickness $T_s$ is/are each about 10 nm. Further, in some embodiments, the first thickness $T_f$ is substantially uniform across the first doping-type wires 202, and/or the second thickness $T_s$ is substantially uniform across the second doping-type wires 204. Further yet, in some embodiments, the first thickness $T_f$ is substantially the same as the second thickness $T_s$. Alternatively, in other embodiments, the first thickness $T_f$ is different than the second thickness $T_s$.

The JSDs 112 further comprise respective gate electrodes 206 straddling the first and second doping-type wires 202, 204, laterally offset from ends of the first and second doping-type wires 202, 204. For ease of illustration, only one of the gate electrodes 206 is labeled 206. In some embodiments, the gate electrodes 206 comprise a gate electrode 206a individual to one of the JSDs 112. Further, in some embodiments, the gate electrodes 206 comprise a gate electrode 206b shared by a plurality of the JSDs 112 that are the same doping type. Further yet, in some embodiments, the gate electrodes 206 comprise a gate electrode 206c shared by a plurality of the JSDs 112 that are different doping types. The gate electrodes 206, may be, for example, metal, doped polysilicon, some other conductor, or a combination of the foregoing.

A gate dielectric layer 208 spaces and electrically insulates the gate electrodes 206 from the first and second doping-type wires 202, 204. The gate dielectric layer 208 may be, for example, silicon dioxide, a high κ dielectric, some other dielectric, or a combination of the foregoing. As used herein, a high κ dielectric is a dielectric with a dielectric constant κ greater than about 3.9, 5.0, 10.0, or 20.0.

In some embodiments, the JSDs 112 are normally ON semiconductor devices that operate in depletion mode. That is to say, in the absence of external electric fields, the selectively-conductive channels of the JSDs 112 are conductive. In response to applying an external electric field to a selectively-conductive channel of a JSD by a respective gate electrode, free or mobile charge carrier (e.g., electrons or holes) are depleted from proximate the respective gate electrode, such that the selectively-conductive channel becomes insulating (i.e., OFF). In effect, the depletion pinches off the flow of current through the selectively-conductive channel.

Interconnect features 114 are stacked within the first and second ILD layers 106, 108. Further, in some embodiments, the interconnect features 114 electrically couple the first and second device layers 102, 110 together. For ease of illustration, only some of the interconnect features 114 are labeled 114. The interconnect features 114 comprise vias 114v and interconnect wires 114w, and the vias 114v comprise a TDV 114t. For ease of illustration, only some of the vias 114v is labeled 114v, and only one of the interconnect wires 114w is labeled 114w. The vias 114v extend vertically to electrically couple neighboring interconnect wires together, and to electrically couple the interconnect wires 114w to the first and second device layers 102, 110. The TDV 114t (a special type of via) further extends through the second device layer 110, from over the second device layer 110 to below the second device layer 110, to facilitate electrical coupling between the first and second device layers 102, 110. The TDV 114t may, for example, have a width $W_t$ greater than a width $W_v$ of other ones of the vias 114v. The interconnect wires 114w extend laterally to electrically neighboring vias together.

With reference to FIGS. 3A and 3B, various views 300A, 300B of some embodiments of a first doping-type JSD 302 is provided. FIG. 3A provides a perspective view 300A of the first doping-type JSD 302, and FIG. 3B provides a cross-sectional view 300B of the first doping-type JSD 302 along line A-A' in FIG. 3A. The first doping-type JSD 302 may, for example, be representative of some or all of the first doping-type JSDs 112f of FIG. 2.

As illustrated, the first doping-type JSD 302 is arranged on a dielectric layer 304, and comprises a doped wire 306. The doped wire 306 is a semiconductor material with a single doping type, and is conductive from end to end in the absence of an external electric field. The single doping type may be, for example, n type or p type. Further, the doped wire 306 has a substantially uniform doping concentration throughout and is devoid of semiconductor junctions (e.g., heterojunctions, Schottky junctions, or PN junctions). The doped wire 306 may be, for example, monocrystalline silicon or some other type of semiconductor.

A gate electrode 308 straddles the doped wire 306 and is spaced from the doped wire 306 by a gate dielectric layer 310. Further, the gate electrode 308 is spaced from ends of the doped wire 306, along the length of the doped wire 306, and divides the doped wire 306 into a selectively-conductive channel 306c (not visible in FIG. 3A) and a pair of source/drain regions 306sd. The selectively-conductive channel 306c is directly under the gate electrode 308, between the source/drain regions 306sd. Further, the selectively-conductive channel 306c is conductive in the absence of an electric field, and may be, for example, insulating in response to an electric field generated by applying a voltage to the gate electrode 308. The gate electrode 308 may be, for example, doped polysilicon, metal, or some other conductive material.

With reference to FIGS. 4A and 4B, various views 400A, 400B of some embodiments of a second doping-type JSD 402 is provided. FIG. 4A provides a perspective view 400A of the second doping-type JSD 402, and FIG. 4B provides a cross-sectional view 400B of the second doping-type JSD 402 along line B-B' in FIG. 4A. The second doping-type JSD 402 may, for example, be representative of some or all of the second doping-type JSDs 112s of FIG. 2.

As illustrated, the second doping-type JSD 402 is arranged on a dielectric layer 404, and comprises a first doping-type wire 406. The first doping-type wire 406 is a semiconductor material with a single doping type. Further, the first doping-type wire 406 has a substantially uniform doping concentration throughout and is devoid of semiconductor junctions. In some embodiments, the first doping-type wire 406 is conductive from end to end in the absence of an external electric field. The first doping-type wire 406 may be, for example, monocrystalline silicon or some other type of semiconductor.

A second doping-type wire 408 overlies the first doping-type wire 406. In some embodiments, the second doping-type wire 408 has the same layout as the first doping-type wire 406, and/or completely covers the first doping-type wire 406. In other embodiments, the second doping-type wire 408 has a different layout than the first doping-type wire 406, and/or partially covers the first doping-type wire 406. Further, the second doping-type wire 408 is a semiconductor material with a single doping type that is opposite that of first doping-type wire 406. For example, the first doping-type wire 406 may be p type and the second doping-type wire 408 may be n type, or vice versa. Further yet, the second doping-type wire 408 has a substantially uniform doping concentration throughout and is devoid of semiconductor junctions (e.g., heterojunctions, Schottky junctions, or PN junctions). The second doping-type wire 408 may be, for example, monocrystalline silicon or some other type of semiconductor.

In some embodiments, the first doping-type wire 406 has a first thickness $T_f$ that is substantially the same as a second thickness $T_s$ of the second doping-type wire 408. Alternatively, in other embodiments, the first thickness $T_f$ is different than the second thickness $T_s$. Further, in some embodiments, the first and second doping-type wires 406, 408 have a combined thickness T (i.e., $T_f+T_s$) between about 1-150 nm, about 5-100 nm, about 10-50 nm, or about 10-30 nm. For example, the combined thickness T may be about 20 nm.

A gate electrode 410 straddles the first and second doping-type wires 406, 408, and is spaced from the first and second doping-type wires 406, 408 by a gate dielectric layer 412. Further, the gate electrode 410 is spaced from ends of the second doping-type wire 408, along the length of the second doping-type wire 408, and divides the second doping-type wire 408 into a selectively-conductive channel 408c (not visible in FIG. 4A) and a pair of source/drain regions 408sd. The selectively-conductive channel 408c is directly under the gate electrode 410, between the source/drain regions 408sd. Further, the selectively-conductive channel 408c is conductive in the absence of an electric field, and may be, for example, insulating in response to an electric field generated by applying a voltage to the gate electrode 410. The gate electrode 410 may be, for example, doped polysilicon, metal, or some other conductive material.

With reference to FIGS. 5A-5D, perspective views 500A-500D of various embodiments of a pair of JSDs 502a, 502b with opposite doping types are provided. The JSDs 502a, 502b may, for example, correspond to the JSDs 112 in box BX of FIG. 2.

Figure 5A:
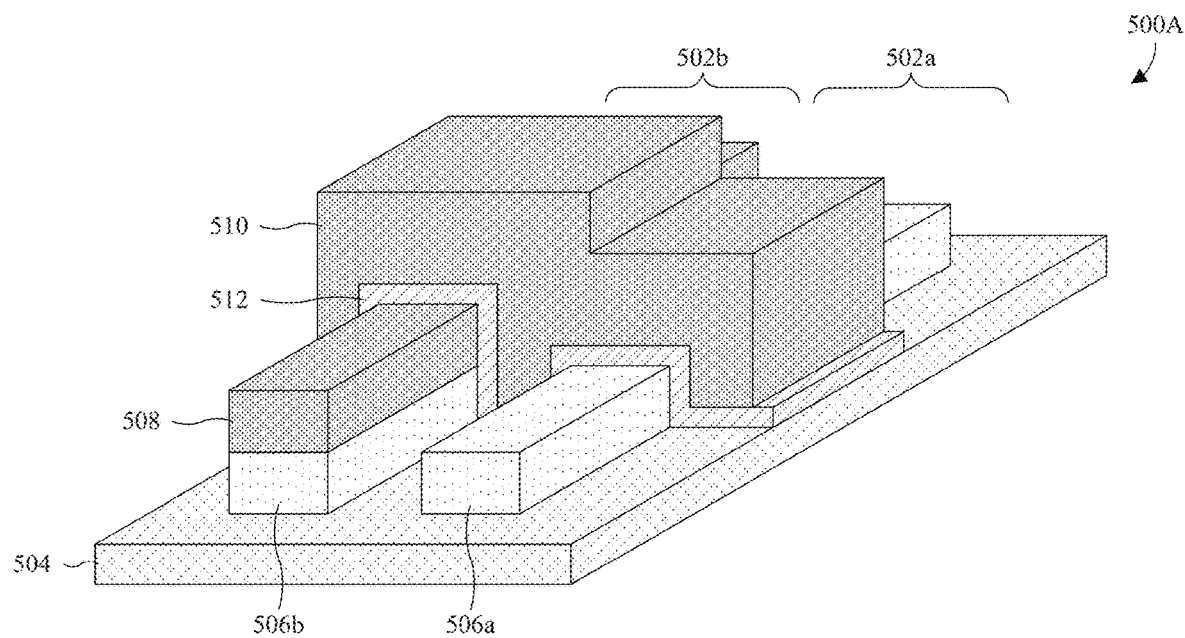
FIGS. 5A-5D illustrate perspective views of various embodiments of a pair of JSDs in FIG. 2.

As illustrated by the perspective view 500A of FIG. 5A, the JSDs 502a, 502b are arranged on a dielectric layer 504, and comprise a first doping-type JSD 502a and a second doping-type JSD 502b. The first and second doping-type JSDs 502a, 502b each comprise a first doping-type wire 506a, 506b. The first doping-type wires 506a, 506b are devoid of semiconductor junctions, and have a single doping type and a uniform doping concentration. Further, the second doping-type JSD 502b, but not the first doping-type JSD 502a, comprises a second doping-type wire 508. The second doping-type wire 508 is also devoid of semiconductor junctions, and has a single doping type opposite that of the first doping-type wires 506a, 506b. Further, the second doping-type wire 508 has a uniform doping concentration, and covers a first doping-type wire 506b of the second doping-type JSD 502b.

A gate electrode 510 straddles the first and second doping-type wires 506a, 506b, 508, and is laterally spaced from ends of the first and second doping-type wires 506a, 506b, 508. Further, the gate electrode 510 is spaced from the first and second doping-type wires 506a, 506b, 508 by a gate dielectric layer 512. In alternative embodiments, the JSDs 502a, 502b may have individual gate electrodes.

Figure 5B:
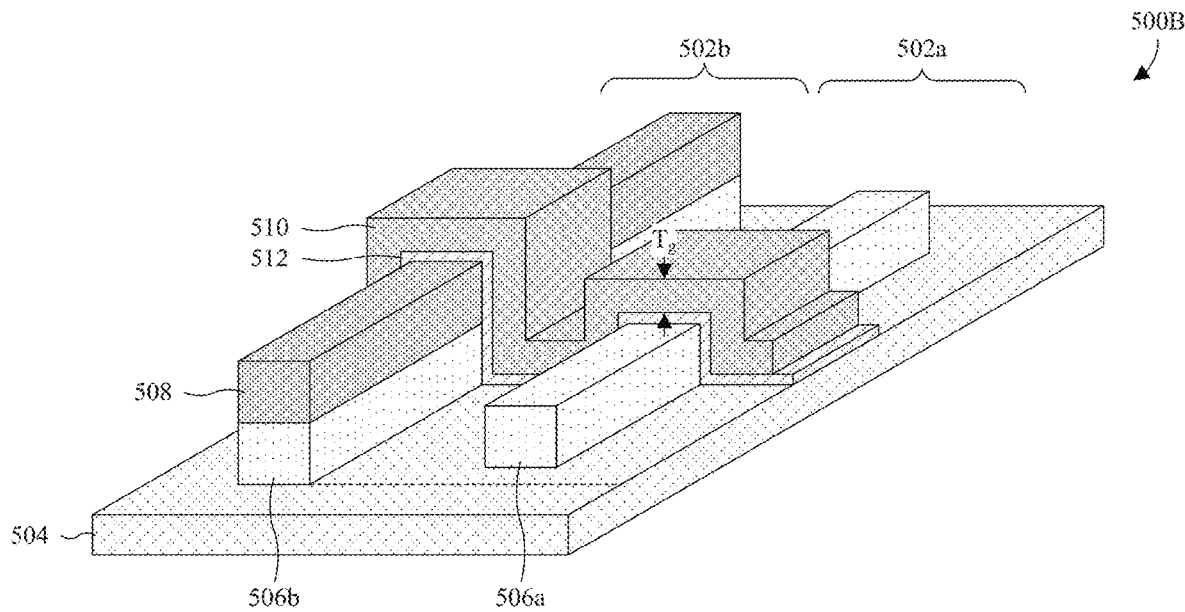

As illustrated by the perspective view 500B of FIG. 5B, a variant of FIG. 5A is provided in which the gate electrode 510 has a U-shaped profile between the first doping-type wires 506a, 506b. Further, in some embodiments, the gate electrode 510 has a substantially uniform thickness $T_g$ along its length, and/or conforms to the first doping-type wires 506a, 506b and the second doping-type wire 508.

Also illustrated by the perspective view 500B of FIG. 5B, the first doping-type wire 506a of the first doping-type JSD 502a has a different layout and/or footprint than the first doping-type wire 506b of the second doping-type JSD 502b. In particular, the first doping-type wires 506a, 506b are illustrated with different lengths. As used herein, a footprint is a two-dimensional (2D) projection of a structure onto an underlying horizontal plane (e.g., a top surface of the dielectric layer 504). Other variations between the footprints and/or layouts are amenable in other embodiments. For example, the footprints and/or layouts may have different shapes, lengths, widths, or a combination of the forgoing.

Figure 5C:
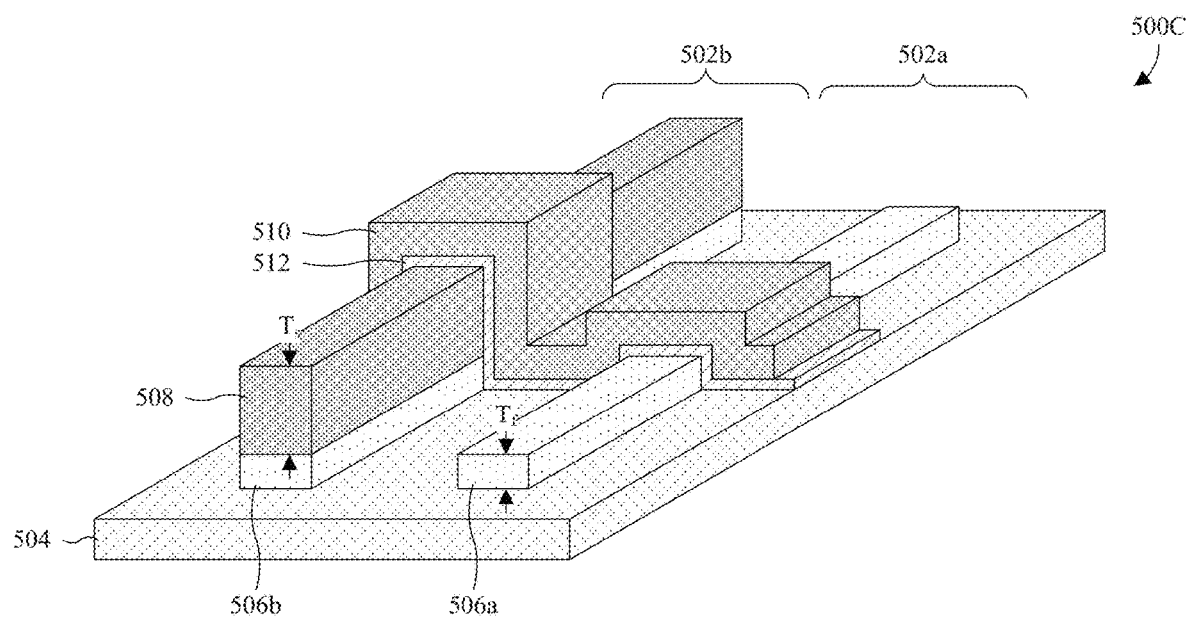

As illustrated by the perspective view 500C of FIG. 5C, a variant of FIG. 5B is provided in which the first doping-type wires 506a, 506b share a first thickness $T_f$ that is less than a second thickness $T_s$ of the second doping-type wire 508. In alternative embodiments, the first thickness $T_f$ is greater than the second thickness $T_s$.

Figure 5D:
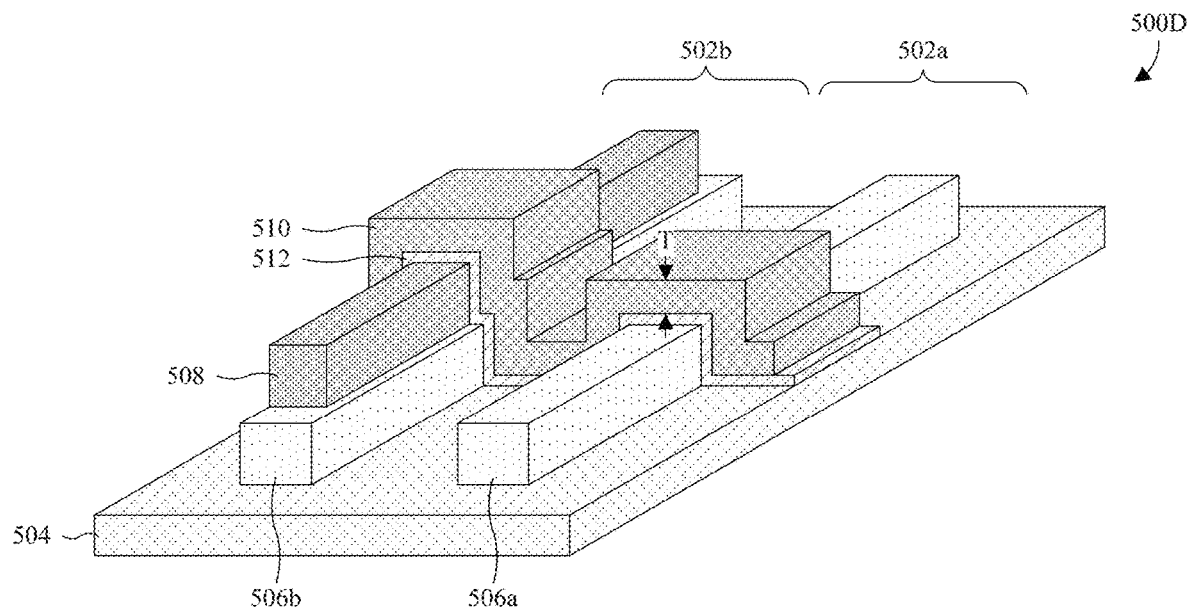

As illustrated by the perspective view 500D of FIG. 5D, a variant of FIG. 5B is provided in which the second doping-type wire 508 has a different layout and/or footprint than the first doping-type wire 506b of the second JSD 502b. In particular, the second doping-type wire 508 is illustrated with a smaller width and a smaller length compared to the first doping-type wire 506b of the second JSD 502b. Other variations between the footprints and/or layouts are amenable in other embodiments. For example, the footprints and/or layouts may have different shapes, lengths, widths, or a combination of the forgoing.

Figure 6A:
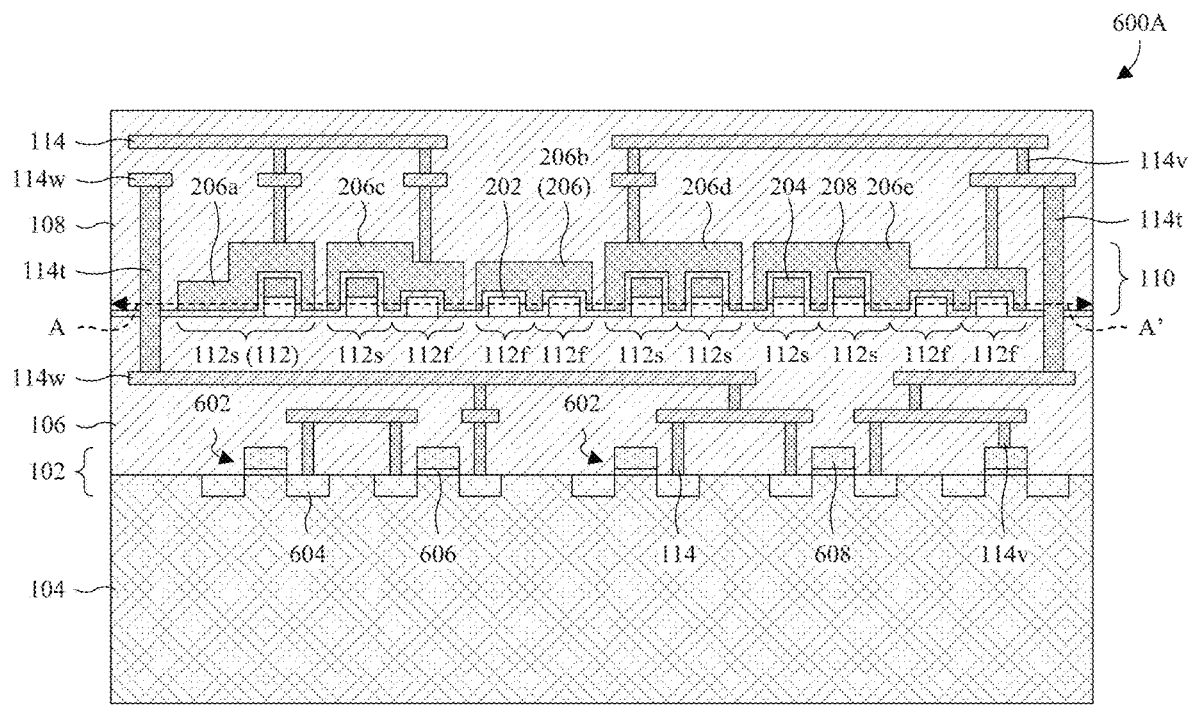
FIGS. 6A and 6B illustrate various views of some more detailed embodiments of the monolithic 3D IC of FIG. 2.
Figure 6B:
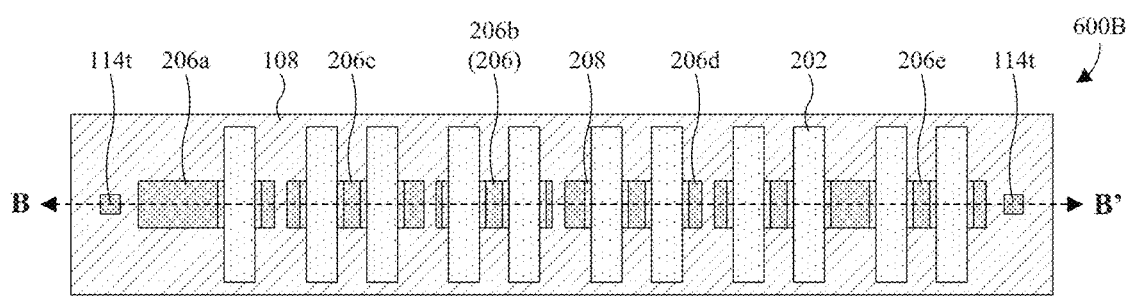

With reference to FIGS. 6A and 6B, various views 600A, 600B of some more detailed embodiments of the monolithic 3D IC of FIG. 2 are provided. FIG. 6A provides a cross-sectional view 600A of the monolithic 3D IC along line B-B' in FIG. 6B, and FIG. 6B provides a layout view of the monolithic 3D IC along line A-A' in FIG. 6A.

As illustrated by the cross-sectional view 600A of FIG. 6A, a first device layer 102 is arranged over and within a semiconductor substrate 104, and comprises a plurality of semiconductor devices 602. For ease of illustration, only some of the semiconductor devices 602 are labeled 602. In some embodiments, some or all of the semiconductor devices 602 each comprise a pair of source/drain regions 604, a gate dielectric layer 606, and a gate electrode 608. The gate electrode 608 is between the source/drain regions 604, and is spaced over the semiconductor substrate 104 by the gate dielectric layer 606. For ease of illustration, only one of the source/drain regions 604 is labeled 604, only one of the gate dielectric layers 606 is labeled 606, and only one of the gate electrodes 608 is labeled 608. Further, in some embodiments, the semiconductor devices 602 have semiconductor junctions (e.g., PN junctions) and/or doping concentration gradients. Further yet, in some embodiments, the semiconductor devices 602 comprise n-type field-effect transistors (FETs) and/or p-type FETs.

A first ILD layer 106 covers the semiconductor substrate 104 and the first device layer 102, and a second ILD layer 108 covers the first ILD layer 106. Further, a second device layer 110 is arranged on the first ILD layer 106, between the first ILD layer 106 and the second ILD layer 108. The second device layer 110 comprises a plurality of JSDs 112. For ease of illustration, only one of the JSDs 112 is labeled 112. In some embodiments, some or all of the JSDs 112 are each directly over and/or aligned along a vertical axis to a respective one of the semiconductor devices 602. The JSDs 112 comprise first doping-type JSDs 112*f*, and/or comprise second doping-type JSDs 112*s*.

The JSDs 112 each comprise a first doping-type wire 202. For ease of illustration, only one of the first doping-type wires 202 is labeled 202. The first doping-type wires 202 are semiconductor wires with a first doping type and define selectively conductive channels for the first doping-type JSDs 112*f*. Further, the second doping-type JSDs 112*s*, but not the first doping-type JSDs 112*f*, each comprise a second doping-type wire 204. For ease of illustration, only one of the second doping-type wires 204 is labeled 204. The second doping-type wires 204 are semiconductor wires with a second doping type opposite the first doping type, and define selectively conductive channels for the second doping-type JSDs 112*s*. Further, the second doping-type wires 204 overlie respective ones of the first doping-type wires 202.

The JSDs 112 further comprise respective gate electrodes 206 straddling the first and second doping-type wires 202, 204. For ease of illustration, only one of the gate electrodes 206 is labeled 206. In some embodiments, the gate electrodes 206 comprise a gate electrode 206*a* individual to one of the JSDs 112. Further, in some embodiments, the gate electrodes 206 comprise a gate electrode (e.g., 206*b* or 206*d*) shared by a plurality of the JSDs 112 that are the same doping type. Further yet, in some embodiments, the gate electrodes 206 comprise a gate electrode (e.g., 206*c* or 206*e*) shared by a plurality of the JSDs 112 that are different doping types. The gate electrodes 206 are spaced and electrically insulated from the first and second doping-type wires 202, 204 by a gate dielectric layer 208.

Interconnect features 114 are stacked within the first and second ILD layers 106, 108, and electrically couple the first and second device layers 102, 110 together. For ease of illustration, only some of the interconnect features 114 are labeled 114. The interconnect features 114 comprise vias 114*v* and interconnect wires 114*w*. For ease of illustration, only some of the vias 114*v* are labeled 114*v*, and only some of the interconnect wires 114*w* are labeled 114*w*. Further, the vias 114*v* comprise TDVs 114*t* extending through the second device layer 110, from over the second device layer 110 to below the second device layer 110, to facilitate electrical coupling of the second device layer 110 to the first device layer 102.

As illustrated by the layout view 600B of FIG. 6B, the first doping-type wires 202 are laterally elongated. For example, the first doping-type wires 202 may be laterally elongated in a direction substantially orthogonal to line B-B'. Further, the gate electrodes 206 straddle the first doping-type wires 202 and are laterally spaced from ends of the first doping-type wires 202. In some embodiments, the gate electrodes 206 are at midpoints along lengths of the first doping-type wires 202. Further, in some embodiments, the second doping-type wires 204 (see FIG. 6A) have the same layouts and/or footprints as respective ones of the first doping-type wires 202, and/or entirely cover the first doping-type wires 202. Further yet, in some embodiments, layouts and/or footprints of the first doping-type wires 202 vary amongst the first doping-type wires 202. For example, one of the first doping-type wires 202 may have an oval shaped layout and/or footprint, whereas another one of the first doping-type wires 202 may have a square or rectangular shaped layout and/or footprint.

Figure 7:
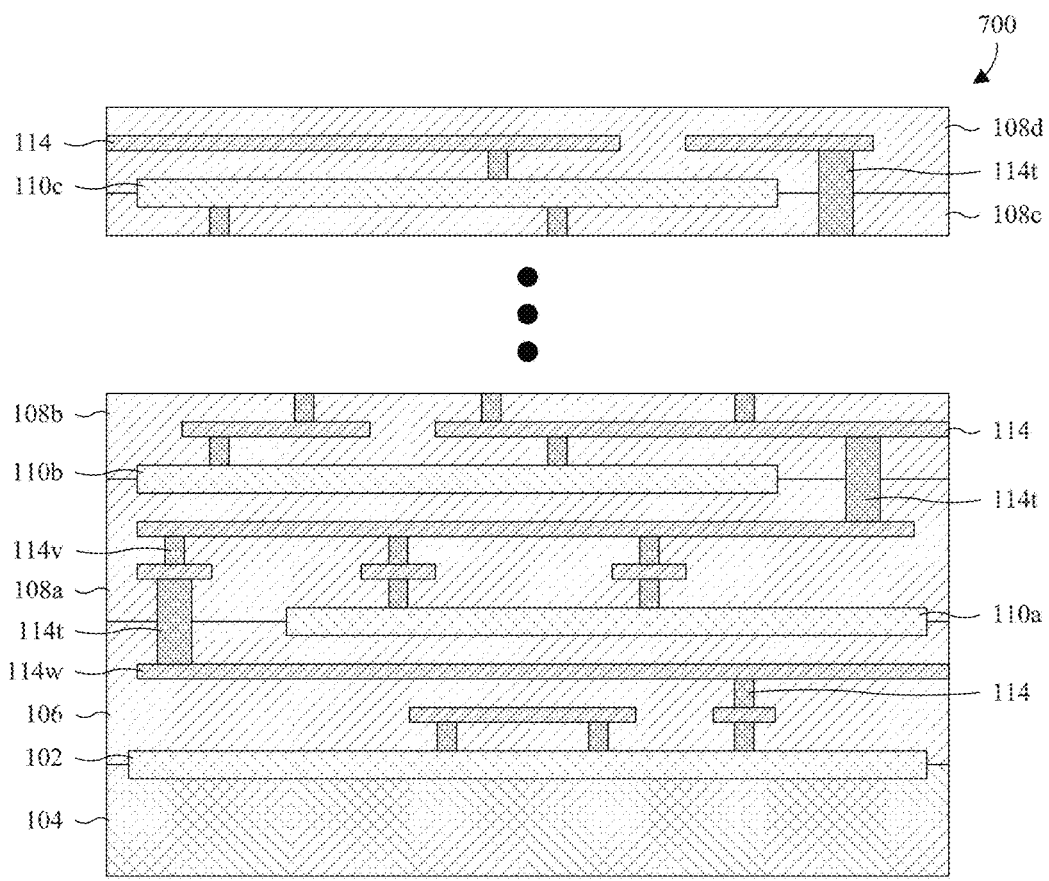
FIG. 7 illustrates a cross-sectional view of some other embodiments of the monolithic 3D IC of FIG. 1.

With reference to FIG. 7, a cross-sectional view 700 of some other embodiments of the monolithic 3D IC of FIG. 1 is provided. As illustrated, a first device layer 102 is arranged over and in a semiconductor substrate 104, and is covered by a first ILD layer 106. The first device layer 102 may, for example, be made up of semiconductor devices with semiconductor junctions. Further, a plurality of second ILD layers 108*a*-108*d* are stacked over the first ILD layer 106, and a plurality of second device layers 110*a*-110*c* are stacked within the first and second ILD layers 106, 108*a*-108*d*. The second ILD layers 108*a*-108*d* may, for example, be configured as the second ILD layer 108 in FIG. 1, 2, or 6A.

The second device layers 110*a*-110*c* are electrically coupled together and to the first device layer 102 by interconnect features 114 in the first and second ILD layers 106, 108*a*-108*d*. For ease of illustration, only some of the interconnect features 114 are labeled 114. The interconnect features 114 comprise vias 114*v* and interconnect wires 114*w* alternatively stacked in the first and second ILD layers 106, 108*a*-108*d*. For ease of illustration, only one of the vias 114*v* is labeled 114*v*, and only one of the interconnect wires 114*w* is labeled 114*w*. The vias 114*v* comprise TDVs 114*t* extending through the second device layers 110*a*-110*c*. The second device layers 110*a*-110*c* may, for example, be made up of JSDs, and/or may, for example, be configured as the second device layer 110 of FIG. 1, 2, or 6A.

With reference to FIGS. 8-10, 11A, 11B, 12A, 12B, and 13-15, a series of cross-sectional views 800-1000, 1100A, 1100B, 1200A, 1200B, and 1300-1500 illustrate some embodiments of a method for manufacturing a monolithic 3D IC. The monolithic 3D IC may, for example, correspond to FIGS. 6A and 6B.

Figure 8:
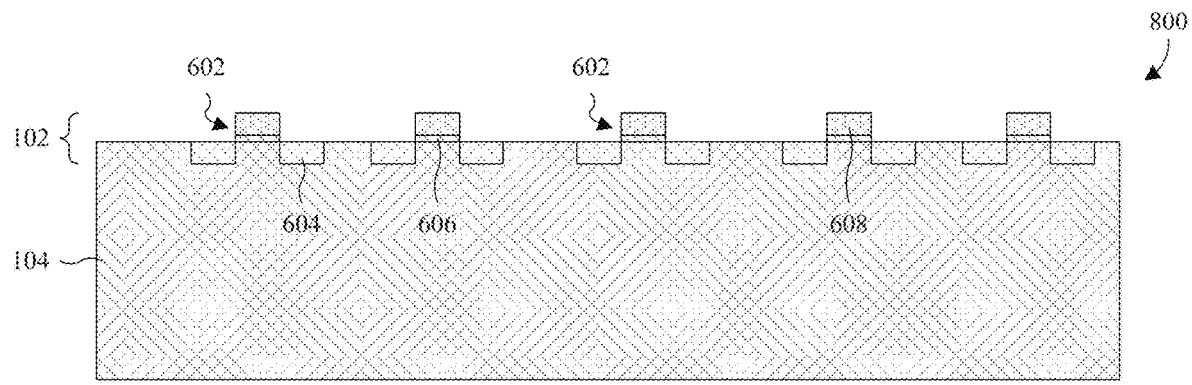
FIGS. 8-10, 11A, 11B, 12A, 12B, and 13-15 illustrate a series of cross-sectional views of some embodiments of a method for manufacturing a monolithic 3D IC.

As illustrated by the cross-sectional view 800 of FIG. 8, a first device layer 102 is formed over and in a semiconductor substrate 104, and comprises a plurality of semiconductor devices 602. For ease of illustration, only some of the semiconductor devices 602 are labeled 602. In some embodiments, all or some of the semiconductor devices 602 each comprise a pair of source/drain regions 604, a gate dielectric layer 606, and a gate electrode 608. The gate electrode 608 is between the source/drain regions 604, and is spaced over the semiconductor substrate 104 by the gate dielectric layer 606. For ease of illustration, only one of the source/drain regions 604 is labeled 604, only one of gate dielectric layers 606 is labeled 606, and only one of the gate electrodes 608 is labeled 608.

In some embodiments, a process for forming the first device layer 102 comprises forming a dielectric layer covering the semiconductor substrate 104, and subsequently forming a conductive layer covering the dielectric layer. Further, in some embodiments, the process comprises selectively etching the dielectric layer and the conductive layer to form the gate electrodes 608 and the gate dielectric layers 606 stacked over the semiconductor substrate 104. Further yet, in some embodiments, the process comprises selectively performing ion implantation into the semiconductor substrate 104, with the gate electrodes 608 and the gate dielectric layers 606 in place, to define the source/drain regions 604, and subsequently annealing the semiconductor substrate 104 to repair damage to the crystalline lattice of the semiconductor substrate 104 by the ion implantation. In some embodiments, the annealing is performed at high temperatures greater than, for example, about 600, 800, 1000, or 1200° C., and/or at high temperatures between, for example, about 600-1200° C., about 800-1000° C., about 750-1200° C., or about 700-1100° C.

Figure 9:
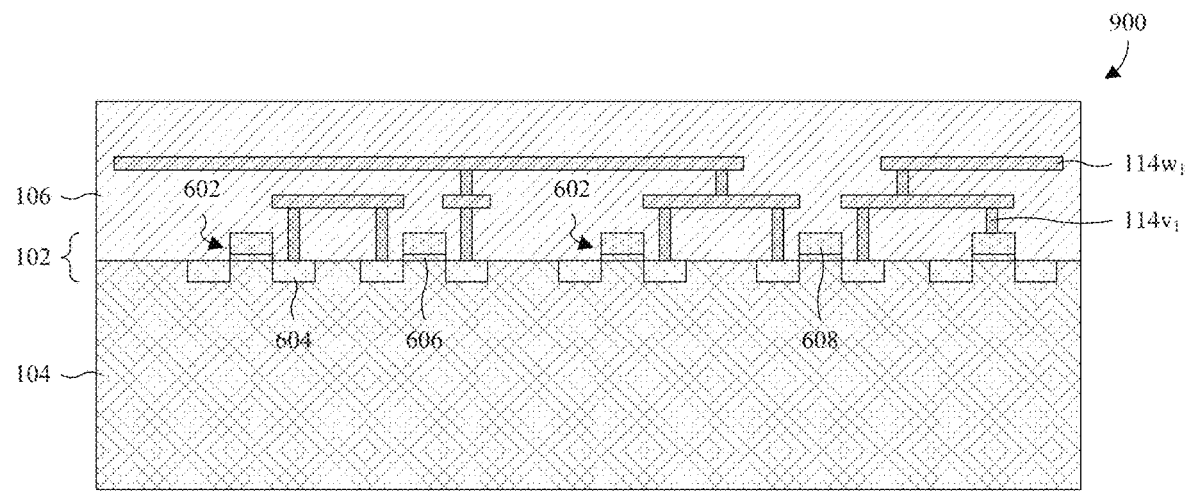

As illustrated by the cross-sectional view 900 of FIG. 9, a first ILD layer 106 is formed covering the first device layer 102, while first interconnect wires $114w_1$ and first vias $114v_1$ are formed alternatingly stacked in the first ILD layer 106. For ease of illustration, only one of the first interconnect wires $114w_1$ is labeled $114w_1$, and only one of the first vias $114v_1$ is labeled $114v_1$. The first interconnect wires $114w_1$ and first vias $114v_1$ are further formed electrically coupled to the first device layer 102. In some embodiments, the first interconnect wires $114w_1$ and the first vias $114v_1$ are formed of aluminum copper, aluminum, copper, tungsten, some other conductive material, or a combination of the foregoing. In some embodiments, the first ILD layer 106 is formed of a transparent material to facilitate alignment between patterns of selective etches performed hereafter and features (e.g., the first interconnect wires $114w_1$ or the first vias $114v_1$) within the first ILD layer 106.

In some embodiments, a process for forming the first ILD layer 106, the first interconnect wires $114w_1$, and the first vias $114v_1$ comprises repeatedly forming an ILD sublayer (i.e., a sublayer of the first ILD layer 106) over the semiconductor substrate 104, performing a planarization into an upper or top surface of the ILD sublayer, selectively etching the ILD sublayer to form a via opening and/or an interconnect wiring opening, and filling the via opening and/or the interconnect wiring opening with a conductive material. The planarization may, for example, be performed by a chemical mechanical polish (CMP), and the etching may, for example, be performed using photolithography.

Figure 10:
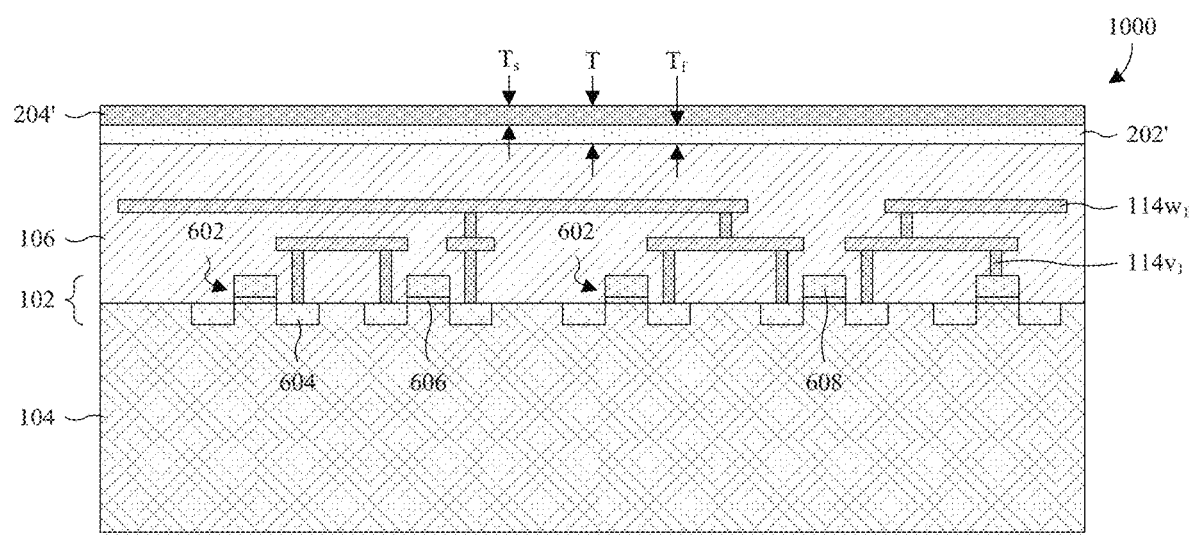

As illustrated by the cross-sectional view 1000 of FIG. 10, a first doping-type layer 202' and a second doping-type layer 204' are transferred to or formed directly on the first ILD layer 106. The first doping-type layer 202' is a semiconductor layer having a first doping type. The second doping-type layer 204' is a semiconductor layer having a second doping type opposite the first doping type, and overlies the first doping-type layer 202'. In some embodiments, the first and second doping-type layers 202', 204' each have a single doping type. Further, in some embodiments, the first and second doping-type layers 202', 204' are devoid of semiconductor junctions and/or have uniform doping concentrations.

In some embodiments, the first doping-type layer 202' is formed with a first thickness $T_f$ between about 3-50 nm, about 1-100 nm, about 10-30 nm, or about 5-15 nm. The first thickness $T_f$ may, for example, be substantially uniform.

Further, in some embodiments, the second doping-type layer 204' is formed with a second thickness $T_s$ that between about 3-50 nm, about 1-100 nm, about 10-30 nm, or about 5-15 nm. The second thickness $T_s$ may be, for example, the same as or different than (e.g., greater or less than) the first thickness $T_f$, and/or may, for example, be substantially uniform. Further yet, in some embodiments, a combined thickness T (i.e., $T_f+T_s$) of the first and second doping-type layers 202', 204' is between about 6-100 nm, about 1-50 nm, about 10-30 nm, or about 50-100 nm.

In some embodiments, a process by which the first and second doping-type layers 202', 204' come to lie on the first ILD layer 106 is performed without exposing the structure of FIG. 9 to high temperatures that may damage underlying layers. For example, the process may be performed at temperatures less than about 500 or 600° C., and/or at temperatures less than the annealing temperature at FIG. 8. As another example, the process may, for example, be performed at temperatures between about 350-500° C. and/or between about 400-450° C. In some embodiments where the first and second doping-type layers 202', 204' are formed directly on the first ILD layer 106, the process comprises vapor-phase epitaxy, molecular-beam epitaxy, some other growth or deposition process, or a combination of the foregoing. In some embodiments where the first and second doping-type layers 202', 204' are transferred to the first ILD layer 106, the process comprises: forming the first and second doping-type layers 202', 204' on a remote substrate (not shown) remote from the structure of FIG. 9; bonding the remote substrate to the first ILD layer 106 through the first and second doping-type layers 202', 204'; and removing the remote substrate. Various embodiments are discussed hereafter.

Transferring the first and second doping-type layers 202', 204' to the first ILD layer 106 is preferred over forming the first and second doping-type layers 202', 204' directly on the first ILD layer 106 because it can be more readily performed without exposing the structure of FIG. 9 to high temperatures. For example, when transferring to the first ILD layer 106, the first and second doping-type layers 202', 204' may be formed remote from the structure of FIG. 9 using high temperature processes, and then transferred to the first ILD layer 106 using low temperature bonding. The high temperature processes may include, for example, annealing to activate dopants implanted by ion implantation and/or to repair crystalline damage from the ion implantation. As such, when transferring to the first ILD layer 106, there are few limitations on the processes that may be used to form the first and second doping-type layers 202', 204'. On the other hand, when forming directly on the first ILD layer 106, the forming is limited to low temperature processes so as to not damage underlying layers.

Figure 11A:
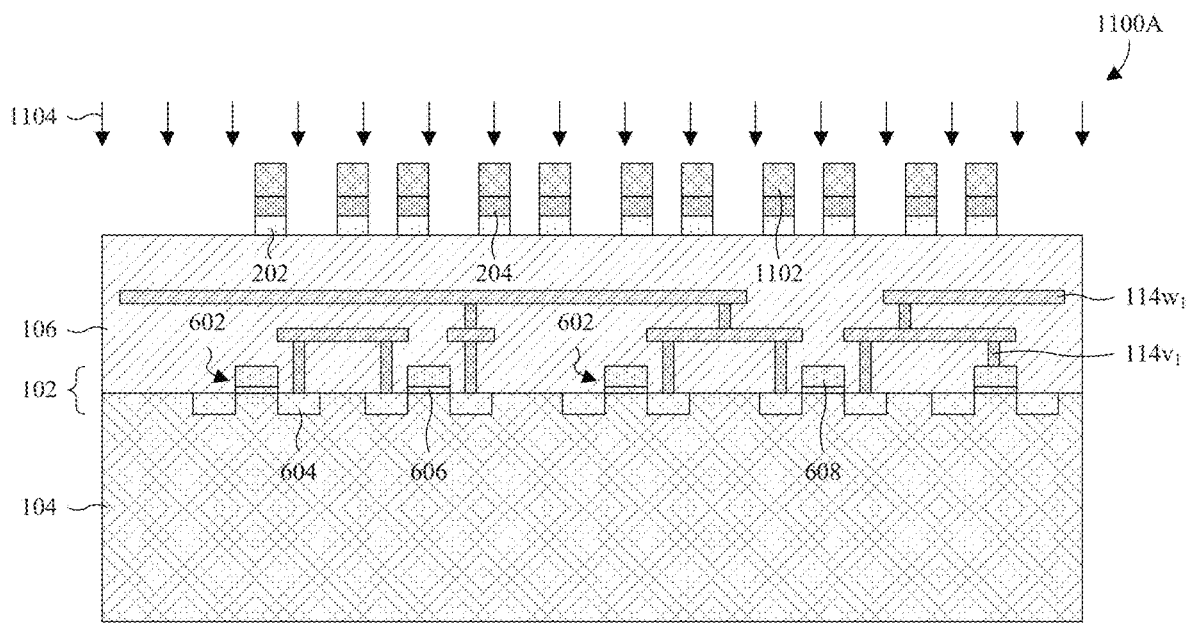
Figure 11B:
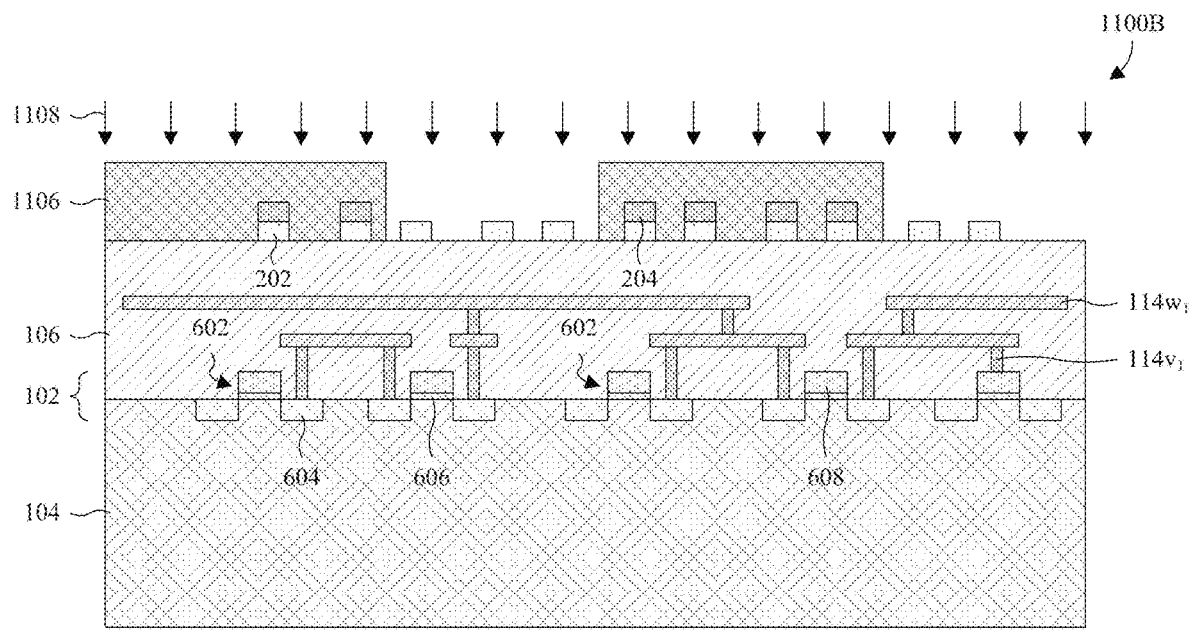

With reference to FIGS. 11A and 11B, first embodiments of a process for forming wires of junctionless semiconductor devices (JSDs) are provided.

As illustrated by the cross-sectional view 1100A of FIG. 11A, a first etch is performed selectively into the first and second doping-type layers 202', 204' (see, e.g., FIG. 10) to define a plurality of first doping-type wires 202, and to further define a plurality of second doping-type wires 204 respectively covering the first doping-type wires 202. For ease of illustration, only one of the first doping-type wires 202 is labeled 202, and only one of the second doping-type wires 204 is labeled 204. As seen hereafter, the first and second doping-type wires 202, 204 correspond to JSDs under manufacture. In some embodiments, the first etch is performed so layouts and/or footprints of the first doping-type wires 202 vary from wire to wire, and/or layouts and/or footprints of the second doping-type wires 204 vary from wire to wire.

In some embodiments, a process for performing the first etch comprises forming a first mask layer 1102 over the first and second doping-type layers 202', 204', and applying a first etchant 1104 to the first and second doping-type layers 202', 204' with the first mask layer 1102 in place until the first and second doping-type wires 202, 204 are formed. Further, in some embodiments, the process comprises removing the first mask layer 1102 after forming the first and second doping-type wires 202, 204. The first mask layer 1102 may be, for example, a hard mask or a photoresist mask, and/or may be, for example, patterned using photolithography.

As illustrated by the cross-sectional view 1100B of FIG. 11B, in some embodiments, a second etch is performed selectively into the second doping-type wires 204 to remove some of the second doping-type wires 204. However, the second etch stops on the first doping-type wires 202 so as to not remove the first doping-type wires 202. As seen hereafter, first doping-type wires uncovered by the second etch define selectively-conductive channels for first doping-type JSDs under manufacture, whereas remaining second doping-type wires define selectively-conductive channels for second doping-type JSDs under manufacture.

In some embodiments, a process for performing the second etch comprises forming a second mask layer 1106 over the second doping-type wires 204, and applying a second etchant 1108 to the second doping-type wires 204 with the second mask layer 1106 in place until some of the second doping-type wires 204 are removed. Further, in some embodiments, the process comprises removing the second mask layer 1106 after removing some of the second doping-type wires 204. The second mask layer 1106 may be, for example, a hard mask or a photoresist mask, and/or may be, for example, patterned using photolithography.

Figure 12A:
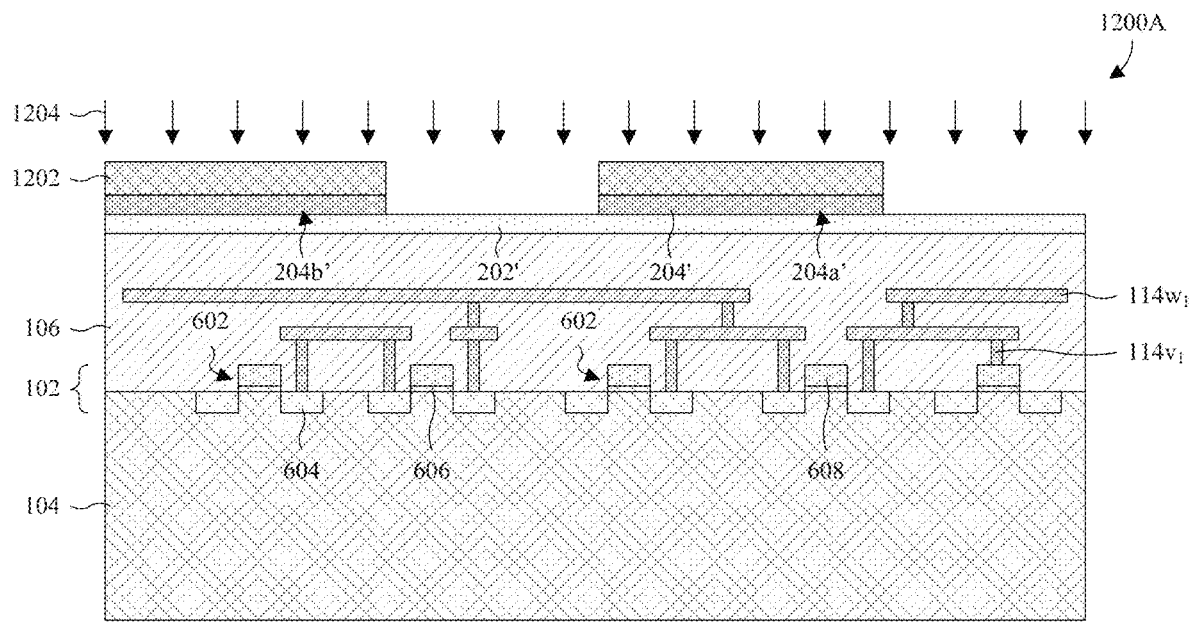
Figure 12B:
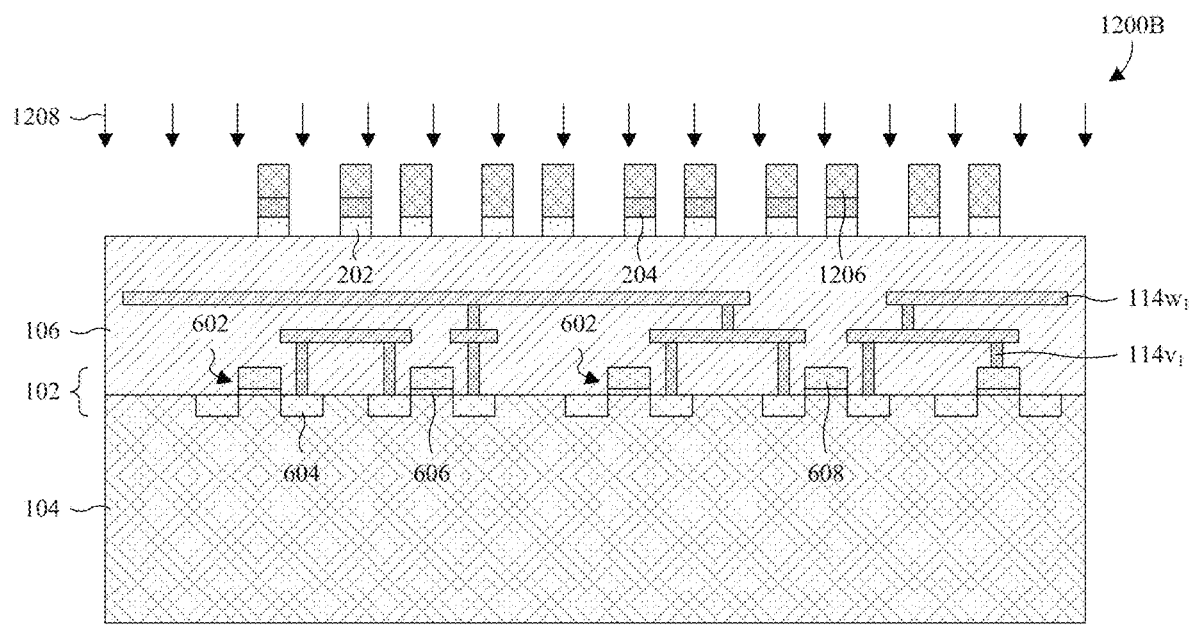

With reference to FIGS. 12A and 12B, second embodiments of the process for forming wires of JSDs are provided. The second embodiments may, for example, be performed in place of the first embodiments of FIGS. 11A and 11B.

As illustrated by the cross-sectional view 1200A of FIG. 12A, a first etch is performed selectively into the second doping-type layer 204', but not the first doping-type layer 202', to divide the second doping-type layer 204' into one or more discrete regions 204a', 204b'. As seen hereafter, second doping-type JSDs under manufacture are formed in the discrete regions 204a', 204b', whereas first doping-type JSDs under manufacture are formed outside the discrete regions 204a', 204b' in the first doping-type layer 202'.

In some embodiments, a process for performing the first etch comprises forming a first mask layer 1202 over the second doping-type layer 204', and applying a first etchant 1204 to the second doping-type layer 204' with the first mask layer 1202 in place until the first doping-type layer 202' is reached. Further, in some embodiments, the process comprises removing the first mask layer 1202 after applying the first etchant 1204. The first mask layer 1202 may be, for example, a hard mask or a photoresist mask, and/or may be, for example, patterned using photolithography.

As illustrated by the cross-sectional view 1200B of FIG. 12B, a second etch is performed selectively into the first and second doping-type layers 202', 204' (see, e.g., FIG. 12A) to define a plurality of first doping-type wires 202, and to further define a plurality of second doping-type wires 204 respectively covering some of the first doping-type wires 202. For ease of illustration, only one of the first doping-type wires 202 is labeled 202, and only one of the second doping-type wires 204 is labeled 204. As seen hereafter, the first and second doping-type wires 202, 204 correspond to JSDs under manufacture. In some embodiments, the second etch is performed so layouts and/or footprints of the first doping-type wires 202 vary from wire to wire, and/or layouts and/or footprints of the second doping-type wires 204 vary from wire to wire.

In some embodiments, a process for performing the second etch comprises forming a second mask layer 1206 over the first and second doping-type layers 202', 204', and applying a second etchant 1208 to the first and second doping-type layers 202', 204' with the second mask layer 1206 in place until the first and second doping-type wires 202, 204 are formed. Further, in some embodiments, the process comprises removing the second mask layer 1206 after forming the first and second doping-type wires 202, 204. The second mask layer 1206 may be, for example, a hard mask or a photoresist mask, and/or may be, for example, patterned using photolithography.

Figure 13:
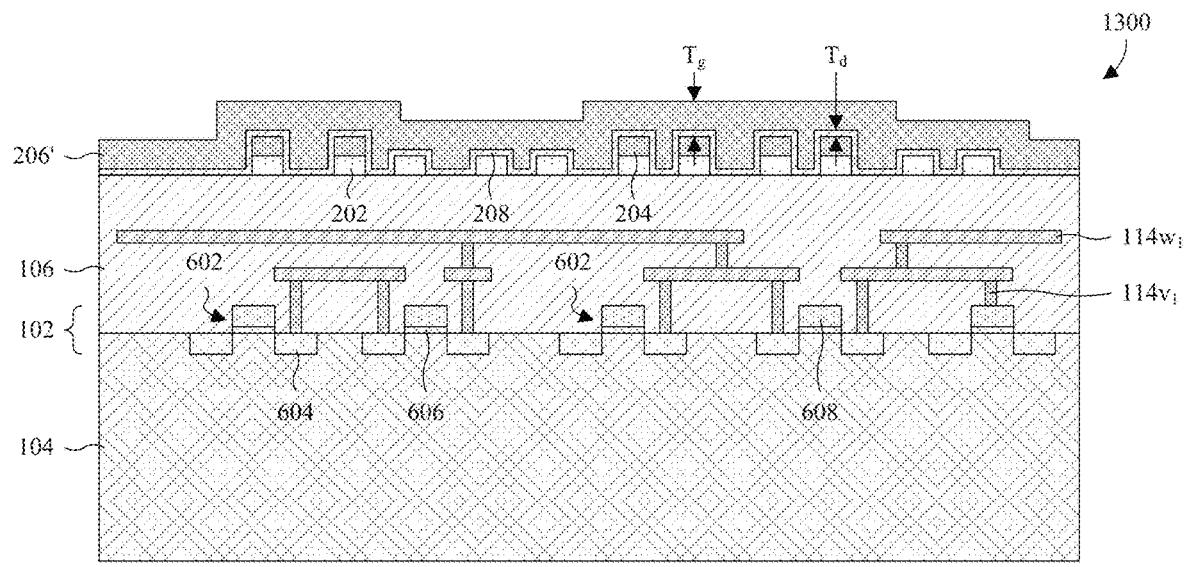

As illustrated by the cross-sectional view 1300 of FIG. 13, a gate dielectric layer 208 and a gate electrode layer 206' are formed stacked over and lining the first and second doping-type wires 202, 204. Further, the gate electrode layer 206' is formed over the gate dielectric layer 208. In some embodiments, the gate dielectric layer 208 and the gate electrode layer 206' are conformal and/or have substantially uniform thicknesses $T_g$, $T_d$.

In some embodiments, a process for forming the gate dielectric layer 208 comprises thermal oxidation, vapor depositing, atomic layer deposition, some other growth or deposition process, or a combination of the foregoing. Further, in some embodiments, a process for forming the gate electrode layer 206' comprises electroless plating, electroplating, vapor deposition, atomic layer deposition some other growth or deposition process, or a combination of the foregoing. In some embodiments, the processes for forming the gate dielectric layer 208 and the gate electrode layer 206' are performed at low temperatures. The low temperatures may include, for example, temperatures less than about 500 or 400° C., and/or less than the annealing temperature at FIG. 8. Further, the low temperatures may, for example, be between about 350-500° C. and/or between about 400-450° C.

Figure 14:
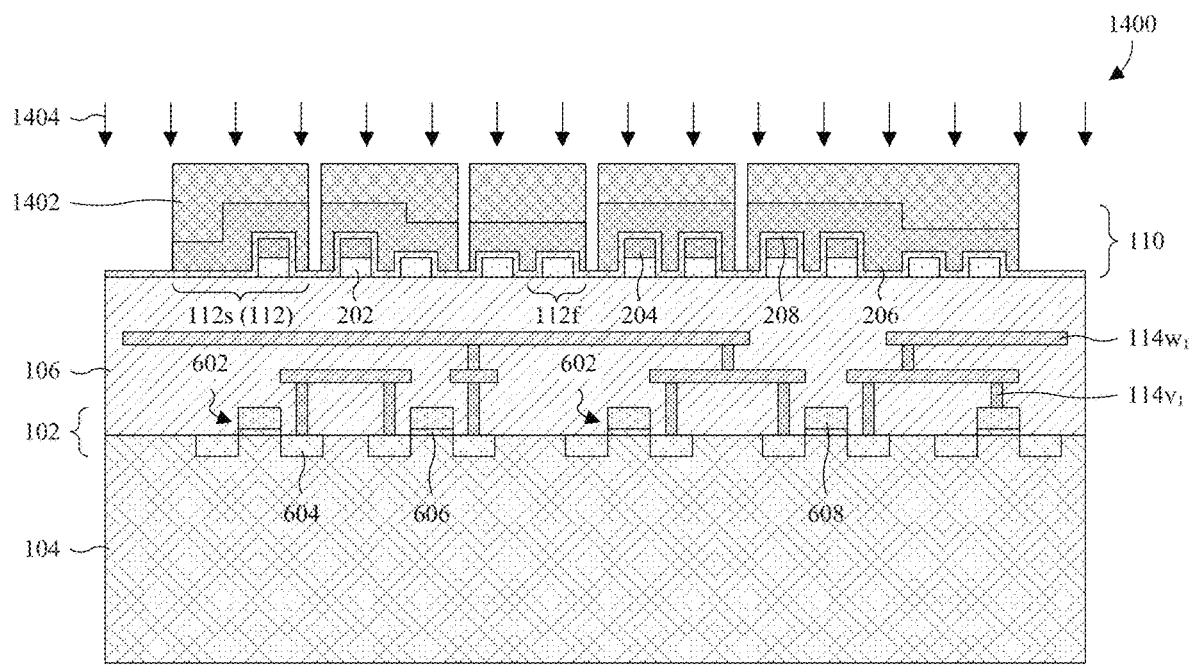

As illustrated by the cross-sectional view 1400 of FIG. 14, a third etch is performed selectively into the gate electrode layer 206' (see, e.g., FIG. 13) and, in some embodiments, the gate dielectric layer 208 to form gate electrodes 206. The gate electrodes 206, as well as the first and second doping-type wires 202, 204, collectively define JSDs 112 making up a second device layer 110. For ease of illustration, only one of the gate electrodes 206 is labeled 206, and only one of the JSDs 112 is labeled 112. The JSDs 112 comprise first doping-type JSDs 112f and/or second doping-type JSDs 112s. For ease of illustration, only one of the first doping-type JSDs 112f is labeled 112f, and only one of the second doping-type JSDs 112s is labeled 112s.

In some embodiments, a process for performing the third etch comprises forming a third mask layer 1402 over the gate electrode layer 206', and applying a third etchant 1404 to the gate electrode layer 206' with the third mask layer 1402 in place until the gate electrodes 206 are formed. Further, in some embodiments, the process comprises removing the third mask layer 1402 after forming the gate electrodes 206. The third mask layer 1402 may be, for example, a hard mask or a photoresist mask, and/or may be, for example, patterned using photolithography.

Advantageously, since the JSDs 112 are junctionless, there is no ion implantation into the first and second doping-type wires 202, 204 (e.g., to form source/drain regions) after forming the gate electrodes 206. As such, there is no high temperature anneal to activate implanted dopants and/or to repair crystalline damage after forming the gate electrodes 206. Accordingly, the JSDs 112 may be formed at low temperatures and without exposing underlying layers to high temperature processes, which may damage the underlying layers. The low temperatures may include, for example, temperatures less than about 500 or 400° C., and/or less than the annealing temperature at FIG. 8. Further, the low temperatures may, for example, be between about 350-500° C. and/or between about 400-450° C.

Figure 15:
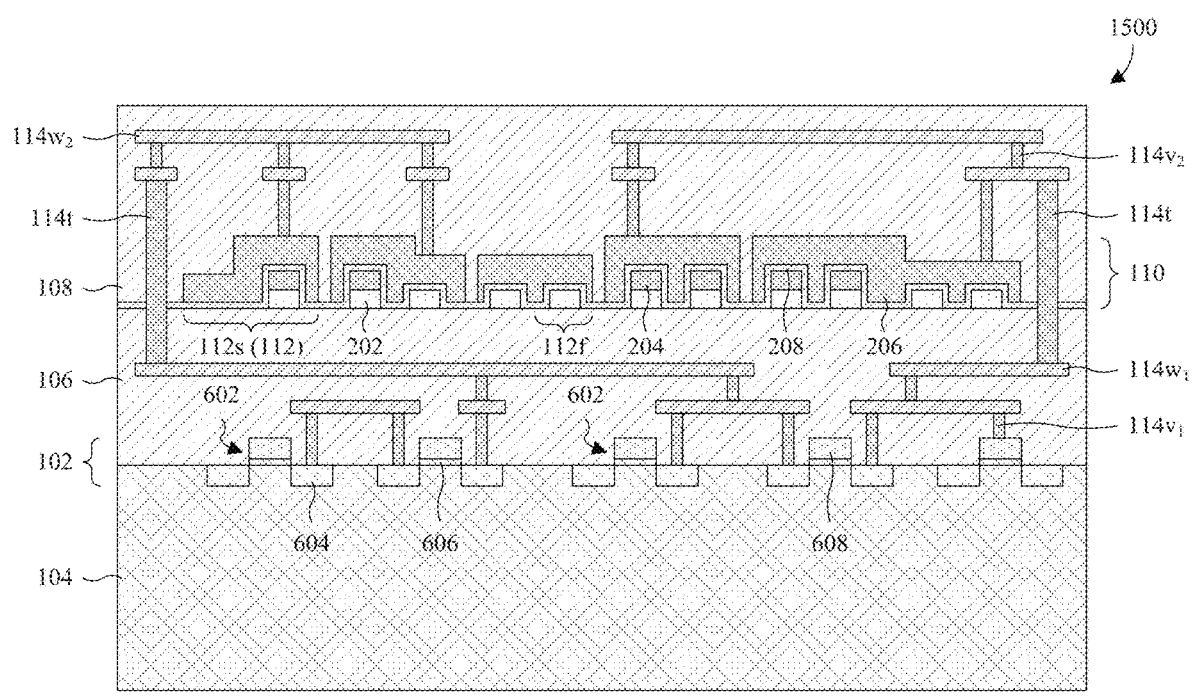

As illustrated by the cross-sectional view 1500 of FIG. 15, a second ILD layer 108 is formed covering the second device layer 110 and the first ILD layer 106, while second interconnect wires $114w_2$ and second vias $114v_2$ are formed alternatingly stacked in the second ILD layer 108. For ease of illustration, only one of the second interconnect wires $114w_2$ is labeled $114w_2$, and only one of the second vias $114v_2$ is labeled $114v_2$. Further, the second interconnect wires $114w_2$ and the second vias $114v_2$ are formed electrically coupled to the second device layer 110, as well as the first interconnect wires $114w_1$ and the first vias $114v_1$. The second vias $114v_2$ comprise TDVs $114t$ extending through the second device layer 110 to the first interconnect wires $114w_1$ to electrically couple the second interconnect wires $114w_2$ to the first interconnect wires $114w_1$.

In some embodiments, the second interconnect wires $114w_2$ and the second vias $114v_2$ are formed as described for the first interconnect wires $114w_1$ and the first vias $114v_1$ with regard to FIG. 9. Further, in some embodiments, a process for forming the TDVs $114t$ comprises performing an etch through a portion of the second ILD layer 108, the gate dielectric layer 208, and a portion of the first ILD layer 106 to form TDV openings exposing interconnect wires, and subsequently filling the TDV openings with a conductive material.

Figure 16:
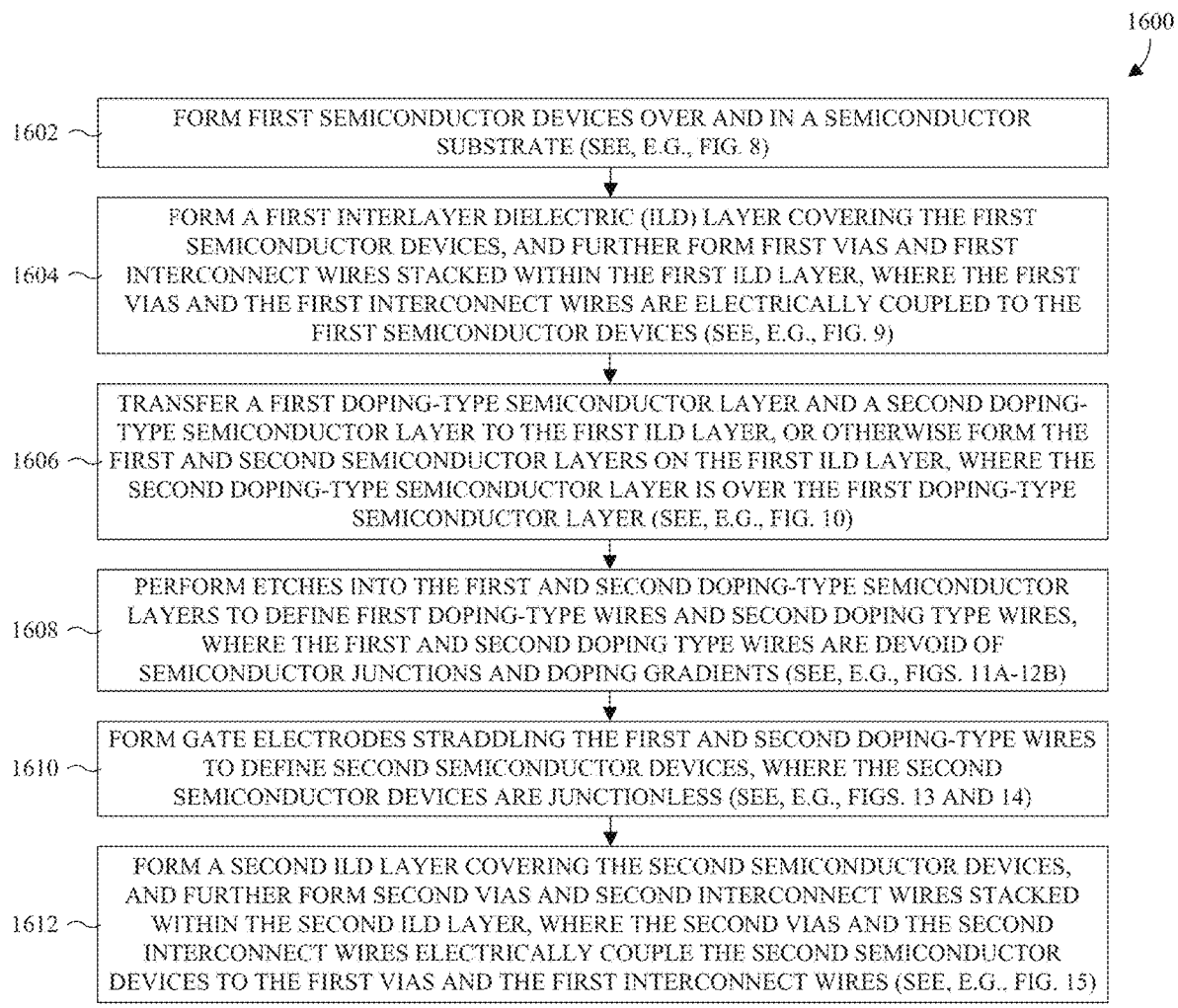
FIG. 16 illustrates a flowchart of some embodiments of the method of FIGS. 8-10, 11A, 11B, 12A, 12B, and 13-15.

With reference to FIG. 16, a flowchart 1600 of some embodiments of the method of FIGS. 8-10, 11A, 11B, 12A, 12B, and 13-15 is provided.

At 1602, first semiconductor devices are formed over and in a semiconductor substrate. See, for example, FIG. 8.

At 1604, a first ILD layer is formed covering the first semiconductor devices. Further, first vias and first interconnect wires are formed stacked within the first ILD layer, where the first vias and the first interconnect wires are electrically coupled to the first semiconductor devices. See, for example, FIG. 9.

At 1606, a first doping-type semiconductor layer and a second doping-type semiconductor layer are transferred to the first ILD layer, or otherwise formed on the first ILD layer. Further, the second doping-type semiconductor layer is over the first doping-type semiconductor layer. See, for example, FIG. 10. Various embodiments of the transfer are described hereafter. The transferring may advantageously be performed at low temperatures that don't damage underlying layers.

At 1608, etches are performed into the first and second doping-type semiconductor layers to define first doping-type wires and second doping type wires, where the first and second doping type wires are devoid of semiconductor junctions and doping gradients. The semiconductor junctions include, for example, heterojunctions, Schottky junctions, and PN junctions. See, for example, FIGS. 11A-12B.

At 1610, gate electrodes are formed straddling the first and second doping-type wires to define second semiconductor devices, where the second semiconductor devices are junctionless. See, for example, FIGS. 13 and 14. Advantageously, ion implantation and annealing are not performed to form source/drain regions after the gate electrode are formed. This, in turn, allows the second semiconductor devices to be formed at low temperatures and without damaging underlying layers.

At 1612, a second ILD layer is formed covering the second semiconductor devices. Further, second vias and second interconnect wires are formed stacked within the second ILD layer, where the second vias and the second interconnect wires electrically couple the second semiconductor devices to the first vias and interconnect wires. See, for example, FIG. 15.

While the flowchart 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 17A-17E, a series of cross-sectional views 1700A-1700E of first embodiments of a process for transferring a first doping-type layer and a second doping-type layer to a substrate is provided. These embodiments and other embodiments described hereafter may, for example, be used to perform the actions of FIG. 10 and/or act 1606 in FIG. 16, such that the substrate may be the first ILD layer 106 of FIG. 9.

Figure 17A:
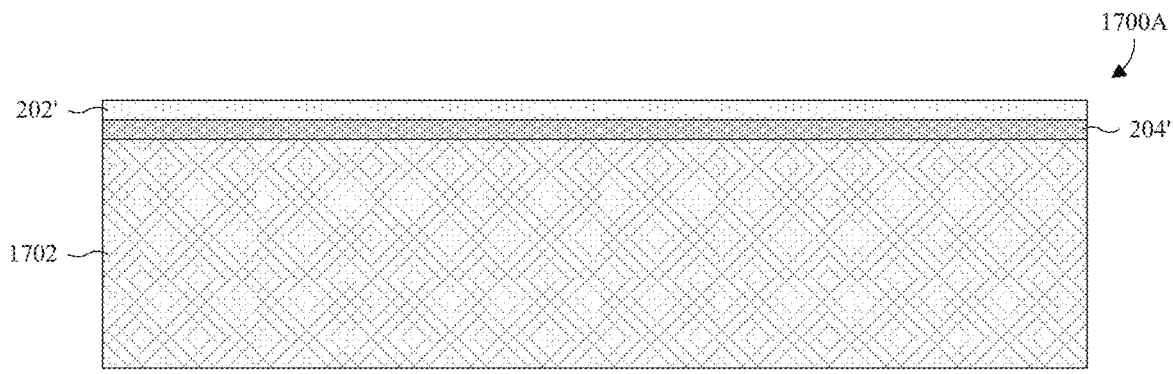
FIGS. 17A-17E illustrate a series of cross-sectional views of first embodiments of a method for transferring a first doping-type layer and a second doping-type layer to a substrate.

As illustrated by the cross-sectional view 1700A of FIG. 17A, a first doping-type layer 202' and a second doping-type layer 204' are formed stacked on a carrier substrate 1702, where the first doping-type layer 202' overlies the second doping-type layer 204'. The carrier substrate 1702 may be, for example, a bulk semiconductor substrate (e.g., of monocrystalline silicon) or some other type of substrate. The first and second doping-type layers 202', 204' are formed with opposite doping types. Further, in some embodiments, the first and second doping-type layers 202', 204' are formed by vapor-phase epitaxy, molecular-beam epitaxy, some other growth or deposition process, or a combination of the foregoing.

Figure 17B:
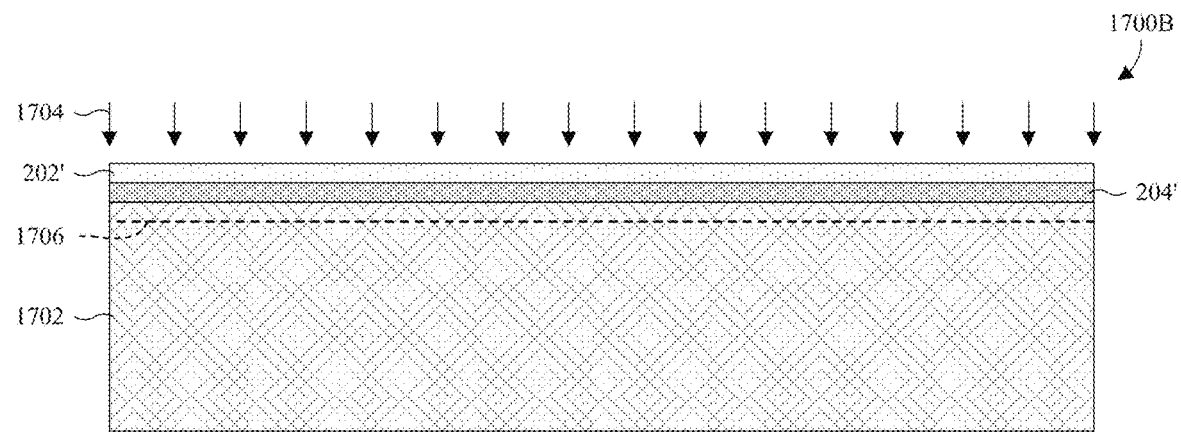

As illustrated by the cross-sectional view 1700B of FIG. 17B, hydrogen ions 1704 are implanted into the carrier substrate 1702, through the first and second doping-type layers 202', 204', to define a hydrogen-rich region 1706 of the carrier substrate 1702 that is spaced under the first and second doping-type layers 202', 204'. In some embodiments, the hydrogen ions 1704 are implanted by ion implantation. Further, in some embodiments, an annealing process is performed after implanting the hydrogen ions 1704 to repair crystalline damage to the first and second doping-type layers 202', 204' and/or to the carrier substrate 1702.

Figure 17C:
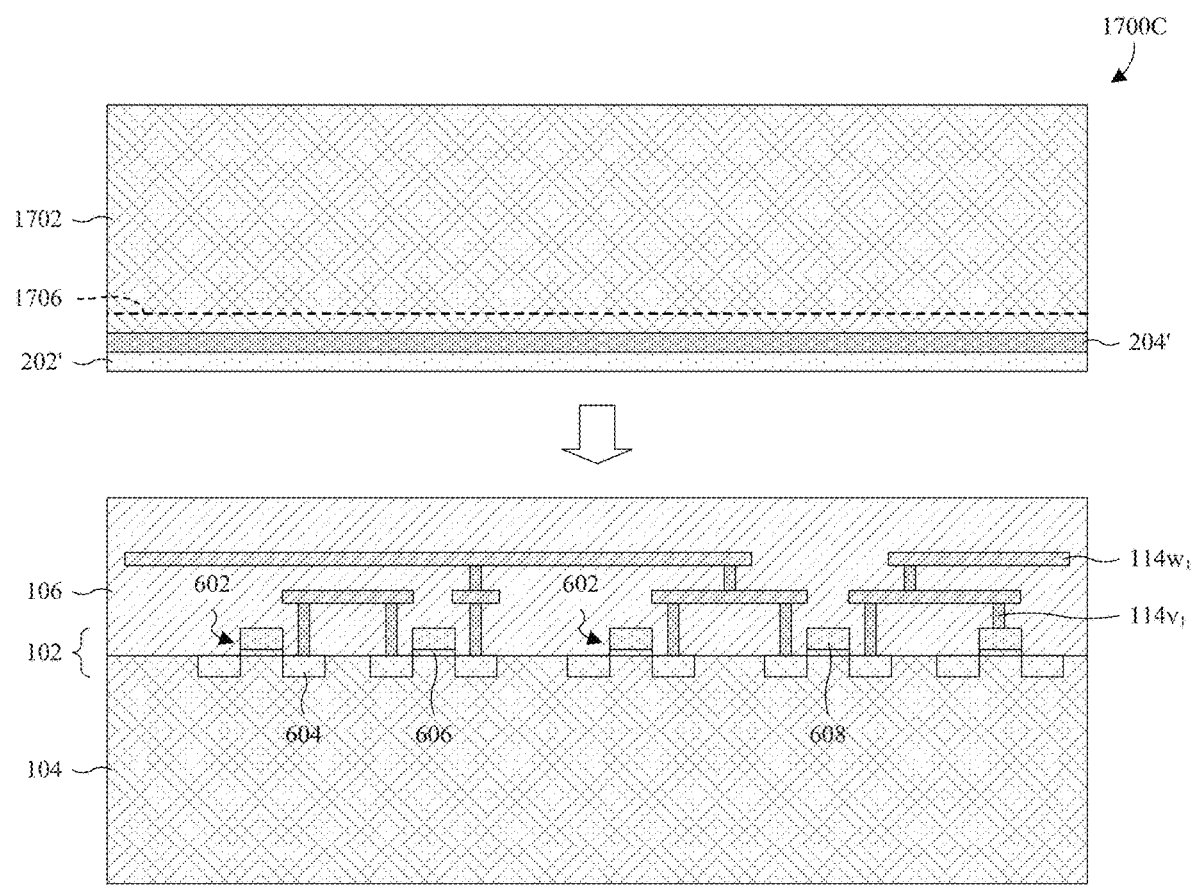

As illustrated by the cross-sectional view 1700C of FIG. 17C, the structure of FIG. 17B is flipped vertically and bonded to a first ILD layer 106 and/or the structure in FIG. 9. In some embodiments, the bonding is performed by, for example, a fusion bonding process.

Figure 17D:
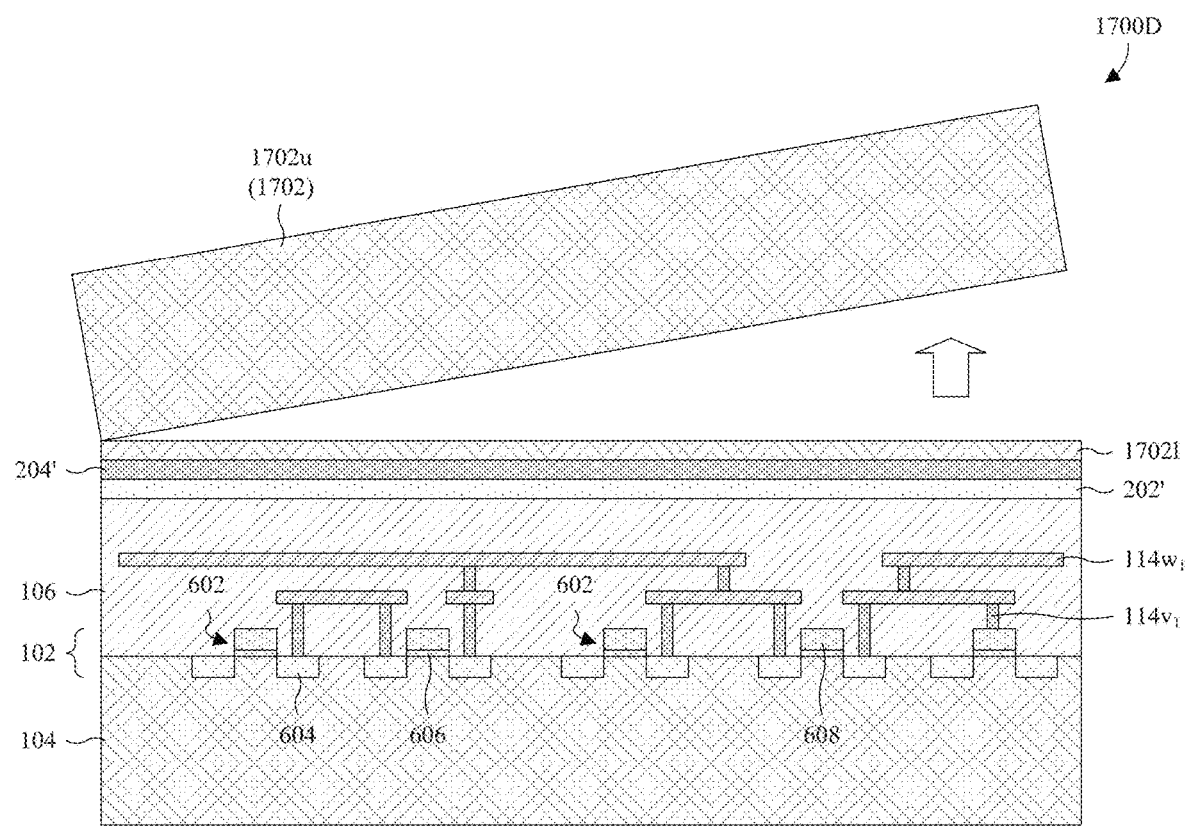

As illustrated by the cross-sectional view 1700D of FIG. 17D, an upper portion $1702u$ of the carrier substrate 1702 is broken off of a lower portion $1702l$ of the carrier substrate 1702, while the lower portion 1702*l* remains bonded to the first ILD layer 106. The upper and lower portions 1702*u*, 1702*l* are demarcated by the hydrogen-rich region 1706 (see, e.g., FIG. 17C) of the carrier substrate 1702, which advantageously weakens the carrier substrate 1702 to allow the upper portion 1702*u* to be readily broken off of the lower portion 1702*l* by, for example, application of mechanical force to the carrier substrate 1702.

Figure 17E:
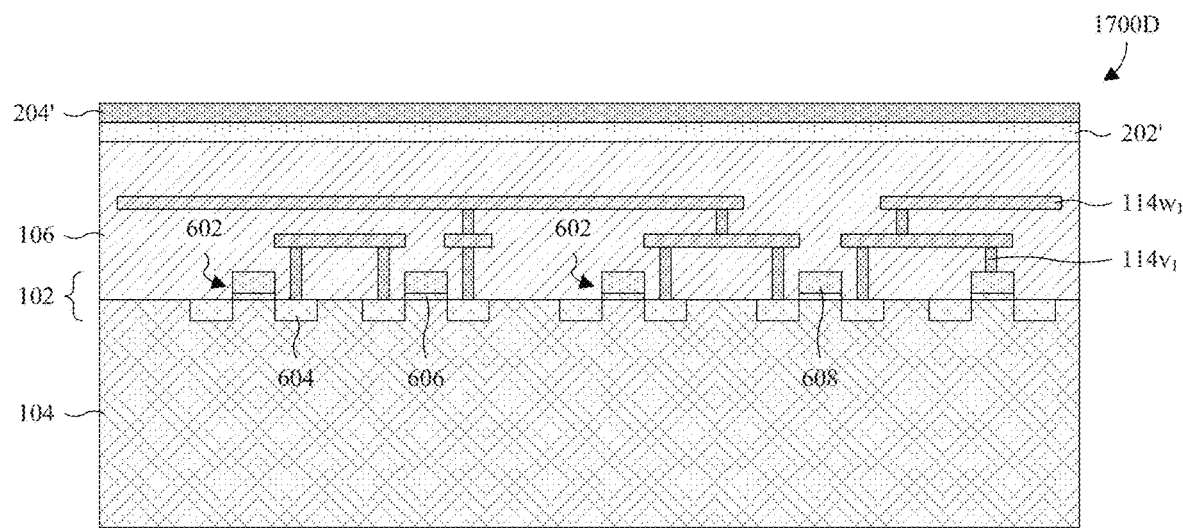

As illustrated by the cross-section view 1700E of FIG. 17E, the lower portion 1702*l* of the carrier substrate 1702 (see, e.g., FIG. 17D) is removed. In some embodiments, the lower portion 1702*l* is removed by an etch and/or a planarization into the lower portion 1702*l*. The planarization may, for example, be performed by a CMP.

With reference to FIGS. 18A-18E, a series of cross-sectional views 1800A-1800E of second embodiments of the process for transferring a first doping-type layer and a second doping-type layer to a substrate is provided.

Figure 18A:
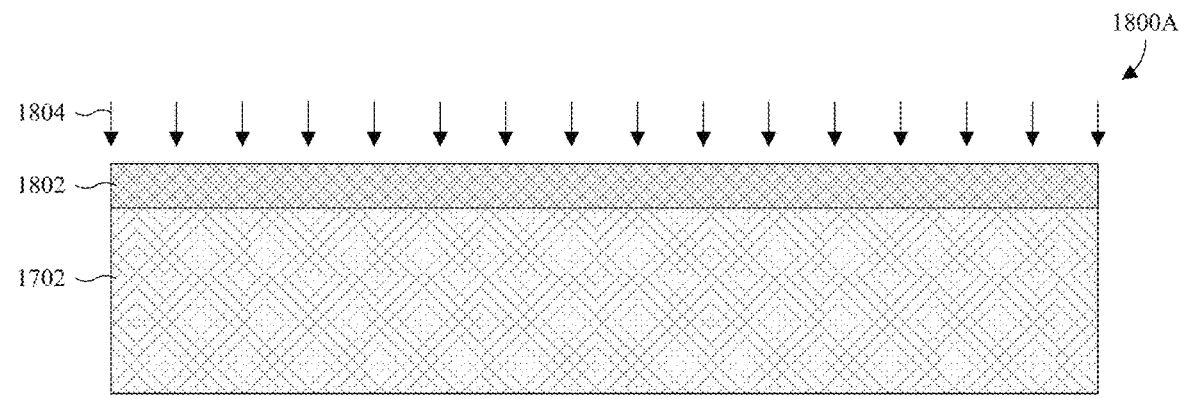
FIGS. 18A-18E illustrate a series of cross-sectional views of second embodiments of the method of FIGS. 17A-17E.

As illustrated by the cross-sectional view 1800A of FIG. 18A, a porous semiconductor layer 1802 is formed on a carrier substrate 1702. The porous semiconductor layer 1802 may be, for example, porous silicon where the carrier substrate is silicon (e.g., monocrystalline silicon). In some embodiments, the process for forming the porous semiconductor layer 1802 comprises performing an etch into the carrier substrate 1702. The etch may, for example, be performed by applying a solution 1804 of hydrofluoric acid to the carrier substrate 1702, and subsequently activating the hydrofluoric acid while the solution 1804 is on the carrier substrate 1702. The hydrofluoric acid may, for example, be activated by applying a sufficient voltage to the solution 1804; by adding an oxidant with a sufficient standard electrode potential to the solution 1804; or by irradiating the solution 1804 with a laser or lamp with a sufficiently short wavelength to excite electrons in the solution 1804 and/or the carrier substrate 1702 to the conduction band.

Figure 18B:
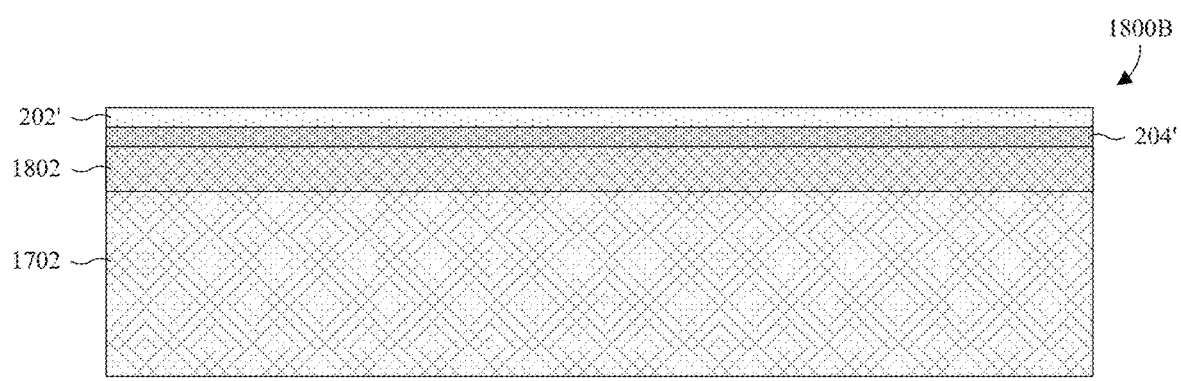

As illustrated by the cross-sectional view 1800B of FIG. 18B, a first doping-type layer 202' and a second doping-type layer 204' are formed stacked on the porous semiconductor layer 1802 of the carrier substrate 1702, where the first doping-type layer 202' overlies the second doping-type layer 204'. The first and second doping-type layer 202' may, for example, be formed as described in FIG. 17A.

Figure 18C:
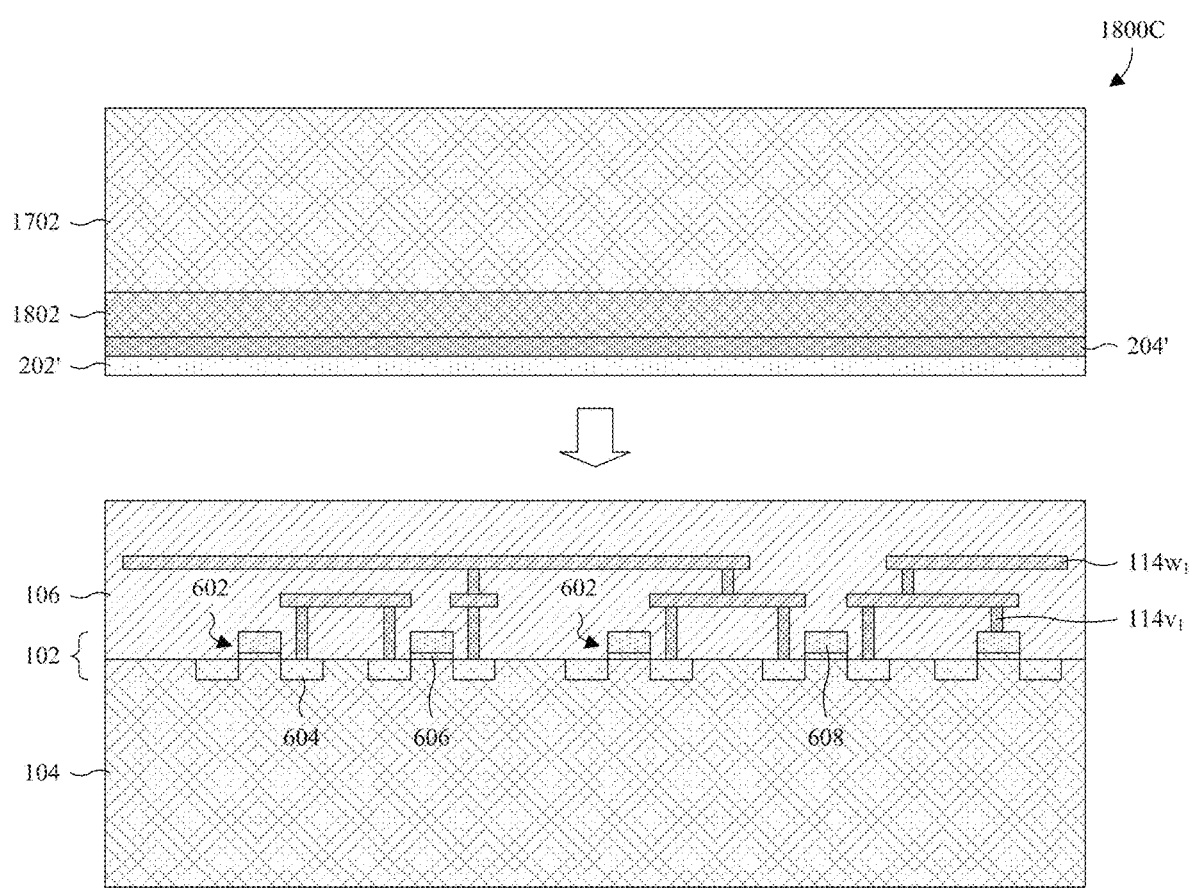

As illustrated by the cross-sectional view 1800C of FIG. 18C, the structure of FIG. 18B is flipped vertically and bonded to a first ILD layer 106 and/or the structure in FIG. 9. In some embodiments, the bonding is performed by, for example, a fusion bonding process.

Figure 18D:
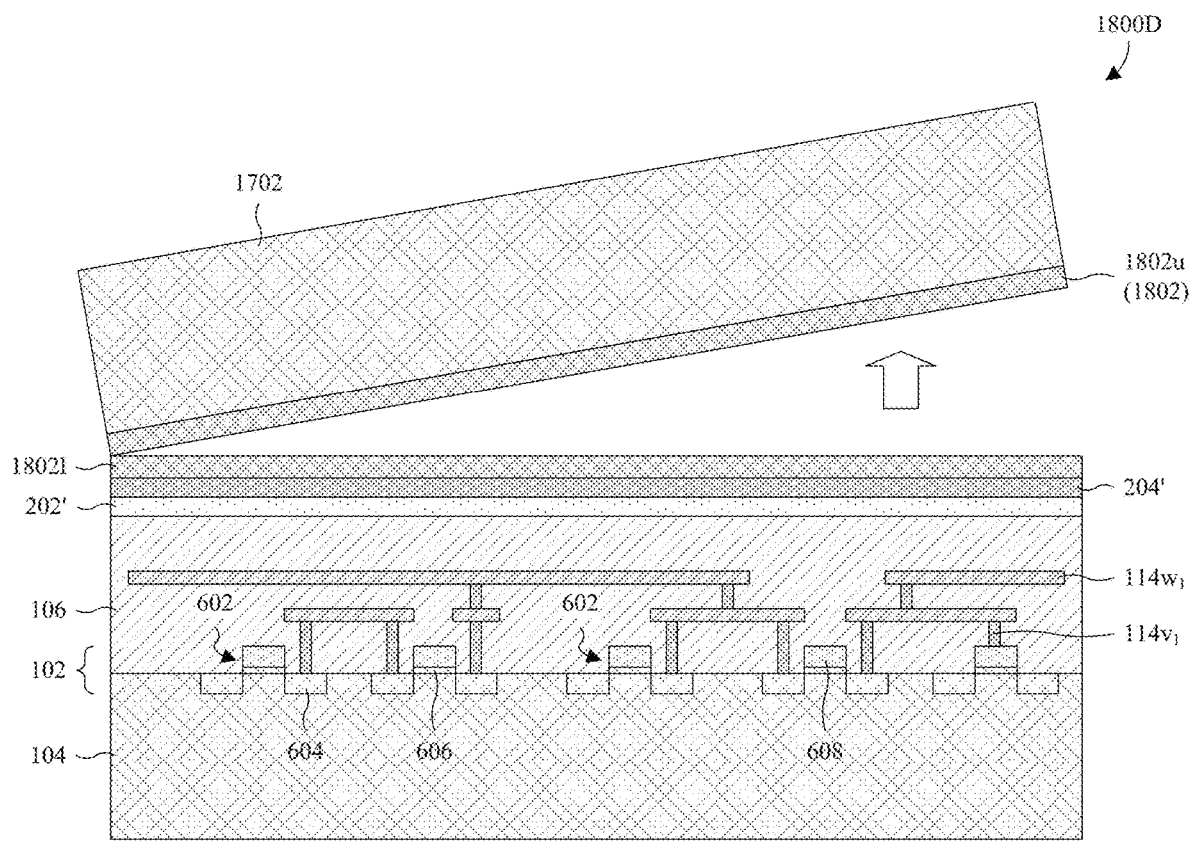

As illustrated by the cross-sectional view 1800D of FIG. 18D, the carrier substrate 1702 and an upper portion 1802*u* of the porous semiconductor layer 1802 are removed from the first ILD layer 106, while a lower portion 1802*l* of the porous semiconductor layer 1802 remains bonded to the first ILD layer 106. In some embodiments, a process for removing the carrier substrate 1702 and the upper portion 1802*u* of the porous semiconductor layer 1802 comprises cutting the porous semiconductor layer 1802 to define the upper and lower portions 1802*u*, 1802*l*. The cutting may, for example, be performed with a water jet.

Figure 18E:
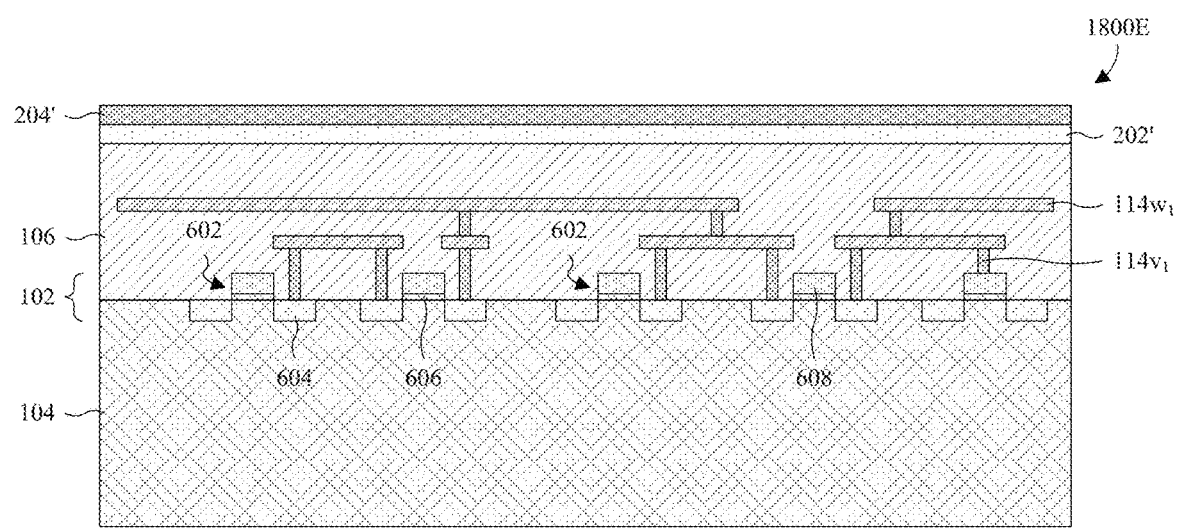

As illustrated by the cross-sectional view 1800E of FIG. 18E, the lower portion 1802*l* of the porous semiconductor layer 1802 (see, e.g., FIG. 18D) is removed. In some embodiments, the lower portion 1802*l* is removed by an etch and/or a planarization into the lower portion 1802*l*. The planarization may, for example, be performed by a CMP.

With reference to FIGS. 19A-19D, a series of cross-sectional views 1900A-1900D of third embodiments of the process for transferring a first doping-type layer and a second doping-type layer to a substrate is provided.

Figure 19A:
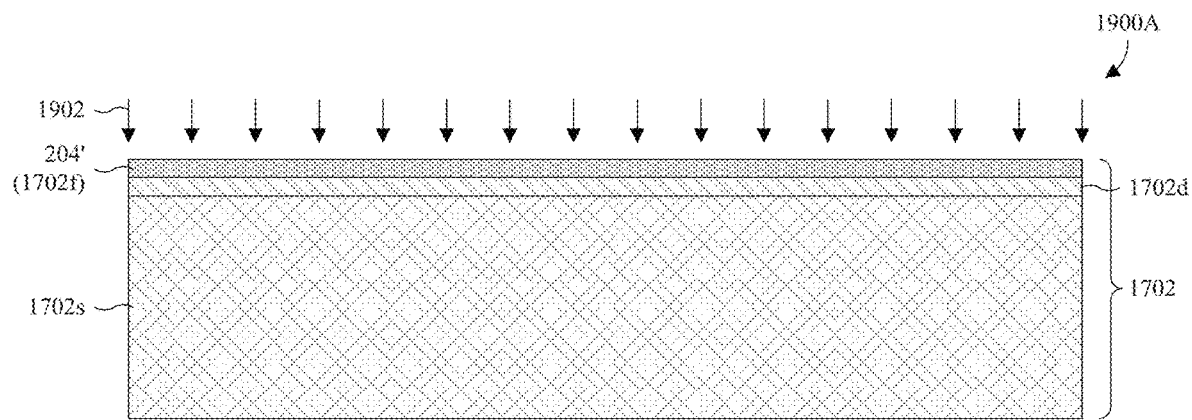
FIGS. 19A-19D illustrate a series of cross-sectional views of third embodiments of the method of FIGS. 17A-17E.

As illustrated by the cross-sectional view 1900A of FIG. 19A, a carrier substrate 1702 is a semiconductor-on-insulator (SOI) substrate, and comprises a first semiconductor layer 1702*f*, a second semiconductor layer 1702*s* under the first semiconductor layer 1702*f*, and a dielectric layer 1702*d* between the first and second semiconductor layers 1702*f*, 1702*s*. The first and second semiconductor layers 1702*f*, 1702*s* may be, for example, silicon (e.g., monocrystalline silicon) or some other type of semiconductor. The dielectric layer 1702*d* may be, for example, an oxide (e.g., silicon dioxide).

Also illustrated by the cross-sectional view 1900A of FIG. 19A, dopants 1902 of a second doping type are implanted into the first semiconductor layer 1702*f* to define a second doping-type layer 204' on the dielectric layer 1702*d*. The dopants 1902 may, for example, be implanted by ion implantation. Further, in some embodiments, an anneal is performed to repair crystalline damage to the first semiconductor layer 1702*f* by the ion implantation.

Figure 19B:
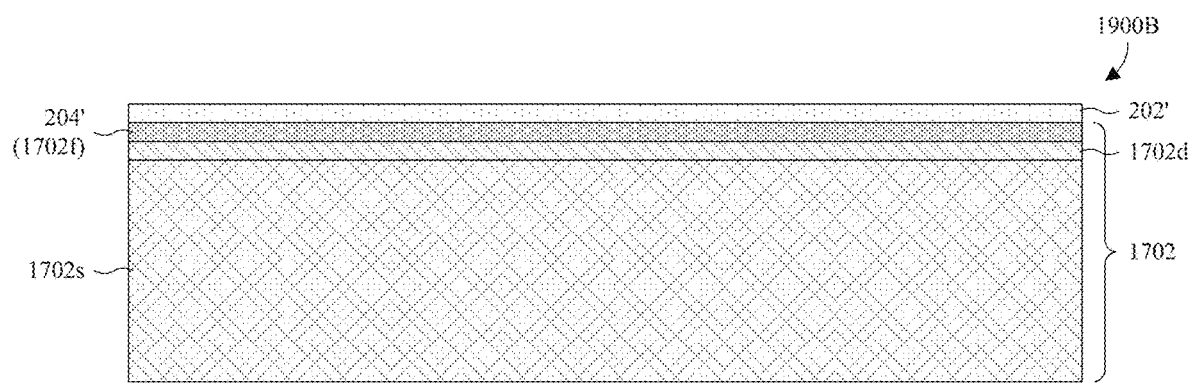

As illustrated by the cross-sectional view 1900B of FIG. 19B, a first doping-type layer 202' is formed on the second doping-type layer 204'. The first doping-type layer 202' has a first doping type opposite the second doping type, and may, for example, be formed by epitaxy and/or as described in FIG. 17A.

Figure 19C:
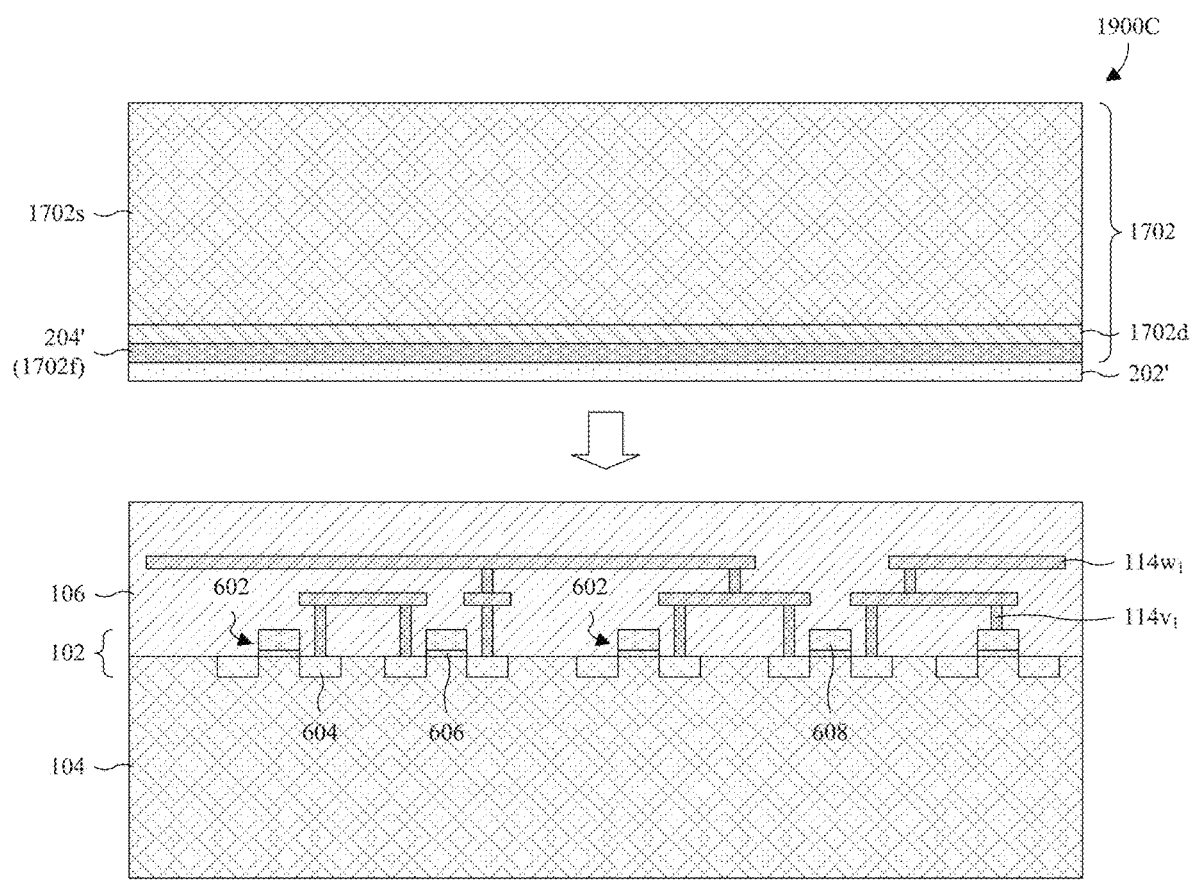

As illustrated by the cross-sectional view 1900C of FIG. 19C, the structure of FIG. 19B is flipped vertically and bonded to a first ILD layer 106 and/or the structure in FIG. 9. In some embodiments, the bonding is performed by, for example, a fusion bonding process.

Figure 19D:
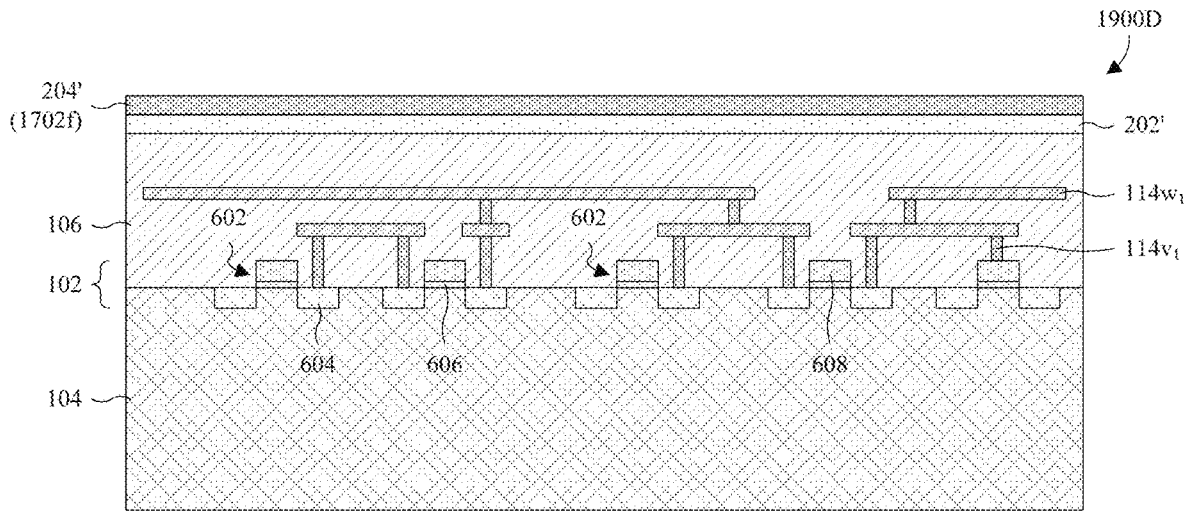

As illustrated by the cross-sectional view 1900D of FIG. 19D, the second semiconductor layer 1702*s* and the dielectric layer 1702*d* are removed. In some embodiments, the second semiconductor layer 1702*s* and the dielectric layer 1702*d* are removed by an etch and/or a planarization into the second semiconductor layer 1702*s* and the dielectric layer 1702*d*. The planarization may, for example, be performed by a CMP.

Figure 20:
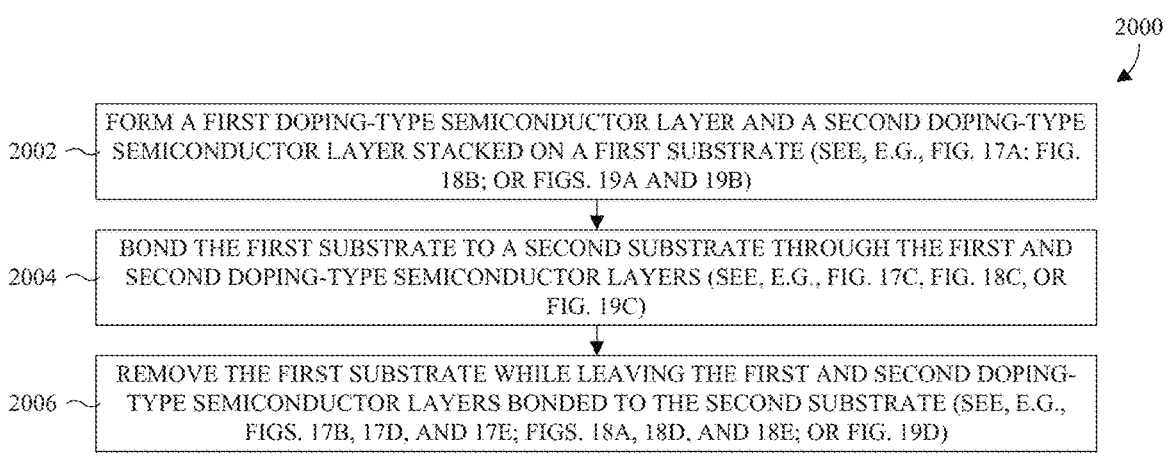
FIG. 20 illustrates a flowchart of some embodiments of the method of FIGS. 17A-17E, 18A-18E, and 19A-19D.

With reference to FIG. 20, a flowchart 2000 of some embodiments of the method of FIGS. 17A-19D is provided.

At 2002, a first doping-type semiconductor layer and a second doping-type semiconductor layer are formed stacked on a first substrate. See, for example, FIG. 17A; FIG. 18B; or FIGS. 19A and 19B.

At 2004, the first substrate is bonded to a second substrate through the first and second doping-type semiconductor layers. See, for example, FIG. 17C, FIG. 18C, or FIG. 19C.

At 2006, the first substrate is removed while leaving the first and second doping-type semiconductor layers bonded to the second substrate. See, for example, FIGS. 17B, 17D, and 17E; FIGS. 18A, 18D, and 18E; or FIG. 19D.

While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide a method for manufacturing an IC. A first ILD layer is formed over a semiconductor substrate, while also forming first vias and first interconnect wires alternatingly stacked in the first ILD layer. A first doping-type layer and a second doping-type layer are transferred to a top surface of the first ILD layer. The first and second doping-type layers are stacked and are semiconductor material with opposite doping types. The first and second doping-type layers are patterned to form a first doping-type wire and a second doping-type wire overlying the first doping-type wire. A gate electrode is formed straddling the first and second doping-type wires. The gate electrode and the first and second doping-type wires at least partially define a JSD.

Further, other embodiments of the present application provide an IC. A first ILD layer covers a semiconductor substrate. First vias and first interconnect wires are alternatingly stacked within the first ILD layer. A semiconductor device is on a top surface of the first ILD layer. The semiconductor device comprises a first doping-type wire, a second doping-type wire overlying the first doping-type wire, and a gate electrode straddling the first and second doping-type wires. The first and second doping-type wires are semiconductor materials with opposite doping types. Further, the first and second doping-type wires are devoid semiconductor junctions and doping concentration gradients.

Further yet, other embodiments of the present application provide another method for manufacturing an IC. A first ILD layer is formed on a semiconductor substrate, while also forming first vias and first interconnect wires alternatingly stacked in the first ILD layer. A first doping-type layer and a second doping-type layer are formed on a remote substrate remote from the semiconductor substrate. The first and second doping-type layers are stacked and are semiconductor materials with opposite doping types. The remote substrate is bonded to a top surface of the first ILD layer through the first and second doping-type layers. The remote substrate is removed from the first ILD layer while leaving the first and second doping-type layers on the first ILD layer. The first and second doping-type layers are patterned to form a first doping-type wire and a second doping-type wire covering the first doping-type wire. A gate electrode is formed straddling the first and second doping-type wires to define a semiconductor device. Second vias and second interconnect wires are formed over the semiconductor device, on the first ILD layer. The second doping-type wire is devoid of semiconductor junctions and doping concentration gradients at the time the second vias and the second interconnect wires are formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit (IC), the method comprising:

forming a first interlayer dielectric (ILD) layer over a semiconductor substrate, while also forming first vias and first interconnect wires alternatingly stacked in the first ILD layer;

transferring a first doping-type layer and a second doping-type layer to a top surface of the first ILD layer, wherein the first and second doping-type layers are stacked and are semiconductor materials with opposite doping types;

patterning the first and second doping-type layers to form a first doping-type wire and a second doping-type wire overlying the first doping-type wire; and forming a gate electrode straddling the first and second doping-type wires, wherein the gate electrode and the first and second doping-type wires at least partially define a junctionless semiconductor device (JSD).

2. The method according to claim 1, wherein the transferring comprises:

forming the first and second doping-type layers on a remote substrate that is remote from the semiconductor substrate;

bonding the remote substrate to the top surface of the first ILD layer through the first and second doping-type layers; and removing the remote substrate from the first ILD layer while leaving the first and second doping-type layers on the first ILD layer.

3. The method according to claim 1, wherein the first doping-type layer extends along and directly contacts the top surface of the ILD layer at an inter-layer interface, wherein the second doping-type layer has a thickness that is different than a thickness of the first doping-type layer, and wherein the thicknesses of the first and second doping-type layers are orthogonal to the inter-layer interface.

4. The method according to claim 1, further comprising:

forming a second ILD layer covering the JSD, while also forming second vias and second interconnect wires alternatingly stacked in the second ILD layer, wherein the second vias comprise a via extending continuously from one of the first interconnect wires to one of the second interconnect wires.

5. The method according to claim 4, wherein at least one of the second vias contacts the JSD, and wherein the first and second doping-type wires are devoid of semiconductor junctions and doping concentration gradients at the time the at least one of the second vias is formed.

6. The method according to claim 1, wherein the patterning comprises:

performing a first etch selectively into the first and second doping-type layers to form a plurality of first doping-type wires and a plurality of second doping-type wires respectively covering the first doping-type wires; and performing a second etch selectively into the second doping-type wires to remove some, but not all, of the second doping-type wires from over the first doping-type wires, wherein the first doping-type wires include the first doping-type wire.

7. The method according to claim 1, wherein the patterning comprises:

performing a first etch selectively into the second doping-type layer, and stopping on the first doping-type layer, to partially remove the second doping-type layer from over the first doping-type layer; and performing a second etch selectively into the first doping-type layer and a remaining portion of the second doping-type layer to form a plurality of first doping-type wires and a plurality of second doping-type wires respectively covering some, but not all, of the first doping-type wires, wherein the first doping-type wires include the first doping-type wire.

8. The method according to claim 1, wherein the patterning further forms another first doping-type wire laterally spaced from and independent of the first and second doping-type wires, and wherein the method further comprises:
forming a gate dielectric layer lining and contacting a top surface of the other first doping-type wire, and lining and contacting a top surface of the second doping-type wire, wherein the gate electrode is formed over and contacting the gate dielectric layer, and wherein the gate dielectric layer and the gate electrode extend continuously from the other first doping-type wire to the second doping-type wire.

9. The method according to claim 1, wherein the first doping-type layer has a first surface facing the top surface of the first ILD layer, and further has a second surface facing away from the top surface of the first ILD layer towards the second doping-type layer, and wherein the first and second surfaces are respectively on opposite sides of first doping-type layer and extend laterally in parallel with the top surface of the first ILD layer.

10. A method for manufacturing an integrated circuit (IC), the method comprising:
forming a first interlayer dielectric (ILD) layer on a semiconductor substrate, while also forming first vias and first interconnect wires alternatingly stacked in the first ILD layer;
forming a first doping-type layer and a second doping-type layer on a remote substrate remote from the semiconductor substrate, wherein the first and second doping-type layers are stacked and are semiconductor materials with opposite doping types;
bonding the remote substrate to a top surface of the first ILD layer through the first and second doping-type layers;
removing the remote substrate from the first ILD layer while leaving the first and second doping-type layers on the first ILD layer;
patterning the first and second doping-type layers to form a first doping-type wire and a second doping-type wire covering the first doping-type wire;
forming a gate electrode straddling the first and second doping-type wires to define a semiconductor device; and
forming second vias and second interconnect wires over the semiconductor device, wherein the second doping-type wire is devoid of semiconductor junctions and doping concentration gradients at the time the second vias and the second interconnect wires are formed.

11. The method according to claim 10, further comprising:
implanting hydrogen ions into the remote substrate, through the first and second doping-type layers, to form a hydrogen-rich region in the remote substrate, wherein the removing of the remote substrate comprises splitting the remote substrate at the hydrogen-rich region.

12. The method according to claim 10, further comprising:
etching the remote substrate to form a porous semiconductor layer from a portion of the remote substrate, wherein the first and second doping-type layers are formed on the porous semiconductor layer, and wherein the removing of the remote substrate comprises splitting the porous semiconductor layer.

13. The method according to claim 10, wherein the remote substrate is a silicon-on-insulator (SOI) substrate comprising a first semiconductor layer, a second semiconductor layer overlying the first semiconductor layer, and an insulating layer between the first and second semiconductor layers, and wherein the forming of the first and second doping-type layers comprises:
doping the second semiconductor layer to form the second doping-type layer; and
depositing the first doping-type layer on the second doping-type layer, wherein the removing of the remote substrate comprises removing the first semiconductor layer and the insulating layer.

14. The method according to claim 10, wherein the patterning comprises:
performing an etch into the first and second doping-type layers with a common mask in place to form the first and second doping-type wires.

15. A method for manufacturing an integrated circuit (IC), the method comprising:
forming a first interconnect structure comprising multiple first vias and multiple first wires alternatingly stacked over a first substrate;
forming a first doping-type layer and a second doping-type layer stacked on a second substrate and respectively having opposite doping types;
bonding the second substrate to the first interconnect structure, such that the first and second doping-type layers are between the second substrate and the first interconnect structure;
removing the second substrate;
patterning the first and second doping-type layers to respectively form a plurality of first doping-type wires and a plurality of second doping-type wires, wherein at least one of the first doping-type wires is completely spaced from the second doping-type wires;
forming a plurality of gate electrodes on the first and second doping-type wires, wherein the gate electrodes respectively straddle the first and second doping-type wires; and
forming a second interconnect structure comprising multiple second vias and multiple second wires alternatingly stacked over, and electrically coupled to, the gate electrodes and the first and second doping-type wires.

16. The method according to claim 15, wherein the first doping-type wires have a single doping type after the forming of the second interconnect structure.

17. The method according to claim 15,
wherein the second doping-type layer is formed over the second substrate, wherein the first doping-type layer is formed over the second doping-type layer, and
wherein the patterning of the first and second doping-type layers forms some of the first doping-type wires respectively underlying the second doping-type wires.

18. The method according to claim 17, wherein the patterning of the first and second doping-type layers comprises:
performing a first etch into the first and second doping-type layers with a first mask in place to form the first and second doping-type wires; and
performing a second etch into the second doping-type wires, but not the first doping-type wires, to remove some of the second doping-type wires.

19. The method according to claim 17, wherein the patterning of the first and second doping-type layers comprises:

performing a first etch into the second doping-type layer, but not the first doping-type layer, with a first mask in place, wherein the first etch forms an opening in the second doping-type layer that exposes the first doping-type layer; and performing a second etch into the first and second doping-type layers with a second mask in place, wherein the second etch forms the first doping-type wires at the opening and to sides of the opening, and further forms the second doping-type wires to sides of the opening but not at the opening.

20. The method according to claim 15, wherein the forming of the second interconnect structure comprises:

forming an interconnect dielectric layer covering the gate electrodes and the first doping-type wires;

forming a through device-layer via (TDV) extending from a top surface of the interconnect dielectric layer to one of the first wires; and forming the first wires and the first vias stacked over and electrically coupled to the gate electrodes, the first doping-type wires, and the TDV.

* * * * *